United States Patent
Oikawa et al.

(10) Patent No.: US 8,102,034 B2
(45) Date of Patent: Jan. 24, 2012

(54) SEMICONDUCTOR DEVICE AND MANUFACTURING METHOD OF THE SAME

(75) Inventors: Yoshiaki Oikawa, Tochigi (JP); Shingo Eguchi, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 240 days.

(21) Appl. No.: 12/564,603

(22) Filed: Sep. 22, 2009

(65) Prior Publication Data

US 2010/0072583 A1 Mar. 25, 2010

(30) Foreign Application Priority Data

Sep. 25, 2008 (JP) ................. 2008-246083

(51) Int. Cl.
*H01L 23/601* (2006.01)
*H01L 23/02* (2006.01)

(52) U.S. Cl. ............... 257/659; 257/679; 257/E23.191; 257/E23.116

(58) Field of Classification Search .............. 257/659, 257/679, E23.191, E23.116
See application file for complete search history.

(56) References Cited

U.S. PATENT DOCUMENTS

| | | | |
|---|---|---|---|
| 6,224,965 B1 | 5/2001 | Haas et al. | |
| 6,403,221 B1 | 6/2002 | Nakamura et al. | |
| 7,049,178 B2 | 5/2006 | Kim et al. | |
| 7,368,318 B2 | 5/2008 | Yamazaki | |
| 7,485,489 B2 | 2/2009 | Björbell | |
| 7,485,511 B2 | 2/2009 | Yamada et al. | |
| 2005/0006126 A1* | 1/2005 | Aisenbrey | 174/68.1 |
| 2005/0068748 A1* | 3/2005 | Ogawa | 361/748 |
| 2005/0233122 A1 | 10/2005 | Nishimura et al. | |
| 2007/0004125 A1 | 1/2007 | Watanabe et al. | |
| 2007/0077691 A1 | 4/2007 | Watanabe | |
| 2007/0181875 A1 | 8/2007 | Yamazaki et al. | |
| 2008/0044940 A1 | 2/2008 | Watanabe et al. | |
| 2008/0224940 A1 | 9/2008 | Sugiyama et al. | |
| 2008/0224941 A1 | 9/2008 | Sugiyama et al. | |
| 2008/0242005 A1 | 10/2008 | Dozen et al. | |
| 2008/0311706 A1 | 12/2008 | Dozen et al. | |
| 2009/0057875 A1 | 3/2009 | Aoki et al. | |
| 2009/0065590 A1 | 3/2009 | Aoki et al. | |

(Continued)

FOREIGN PATENT DOCUMENTS

EP   1 092 739 A1   4/2001

(Continued)

OTHER PUBLICATIONS

International Search Report re application No. PCT/JP2009/065558, dated Dec. 1, 2009.

(Continued)

*Primary Examiner* — Cuong Q Nguyen
*Assistant Examiner* — Cathy N Lam
(74) *Attorney, Agent, or Firm* — Husch Blackwell LLP

(57) ABSTRACT

With the use of a conductive shield formed on the top or bottom side of a semiconductor integrated circuit, an electrostatic breakdown (malfunctions of the circuit or damages of a semiconductor element) of the semiconductor integrated circuit due to electrostatic discharge is prevented, and sufficient communication capability is obtained. With the use of a pair of insulators which sandwiches the semiconductor integrated circuit, a highly reliable semiconductor device that is reduced in thickness and size and has resistance to an external stress can be provided. A semiconductor device can be manufactured with high yield while defects of shapes and characteristics due to an external stress or electrostatic discharge are prevented in the manufacturing process.

34 Claims, 16 Drawing Sheets

U.S. PATENT DOCUMENTS

| | | |
|---|---|---|
| 2009/0278252 A1 | 11/2009 | Oikawa et al. |
| 2009/0289340 A1 | 11/2009 | Yamazaki et al. |
| 2009/0289341 A1 | 11/2009 | Yamazaki et al. |
| 2009/0302456 A1 | 12/2009 | Oikawa et al. |
| 2010/0065952 A1 | 3/2010 | Oikawa et al. |
| 2010/0072548 A1 | 3/2010 | Eguchi et al. |

FOREIGN PATENT DOCUMENTS

| | | |
|---|---|---|
| EP | 1 589 797 A2 | 10/2005 |
| EP | 1 818 860 A2 | 8/2007 |
| JP | 10-92980 | 4/1998 |
| JP | 2002-366918 | 12/2002 |
| JP | 2003-228695 | 8/2003 |
| JP | 2005-284352 | 10/2005 |
| JP | 2007-123859 | 5/2007 |
| JP | 2007-241999 | 9/2007 |
| WO | WO 01/01740 A1 | 1/2001 |
| WO | WO 2004/001848 A1 | 12/2003 |
| WO | WO 2007/043285 A1 | 4/2007 |

OTHER PUBLICATIONS

Written Opinion re application No. PCT/JP2009/065558, dated Dec. 1, 2009.

* cited by examiner

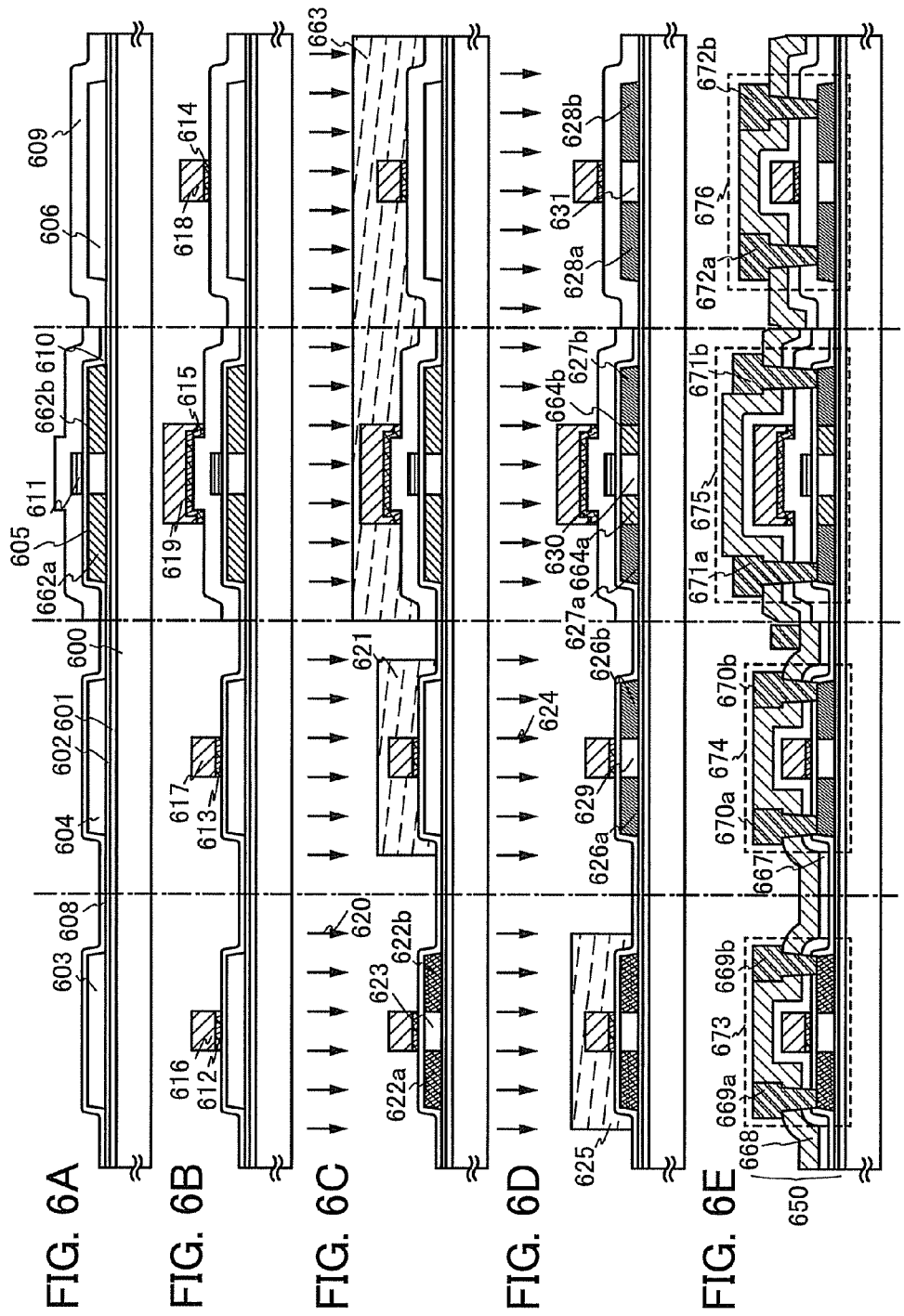

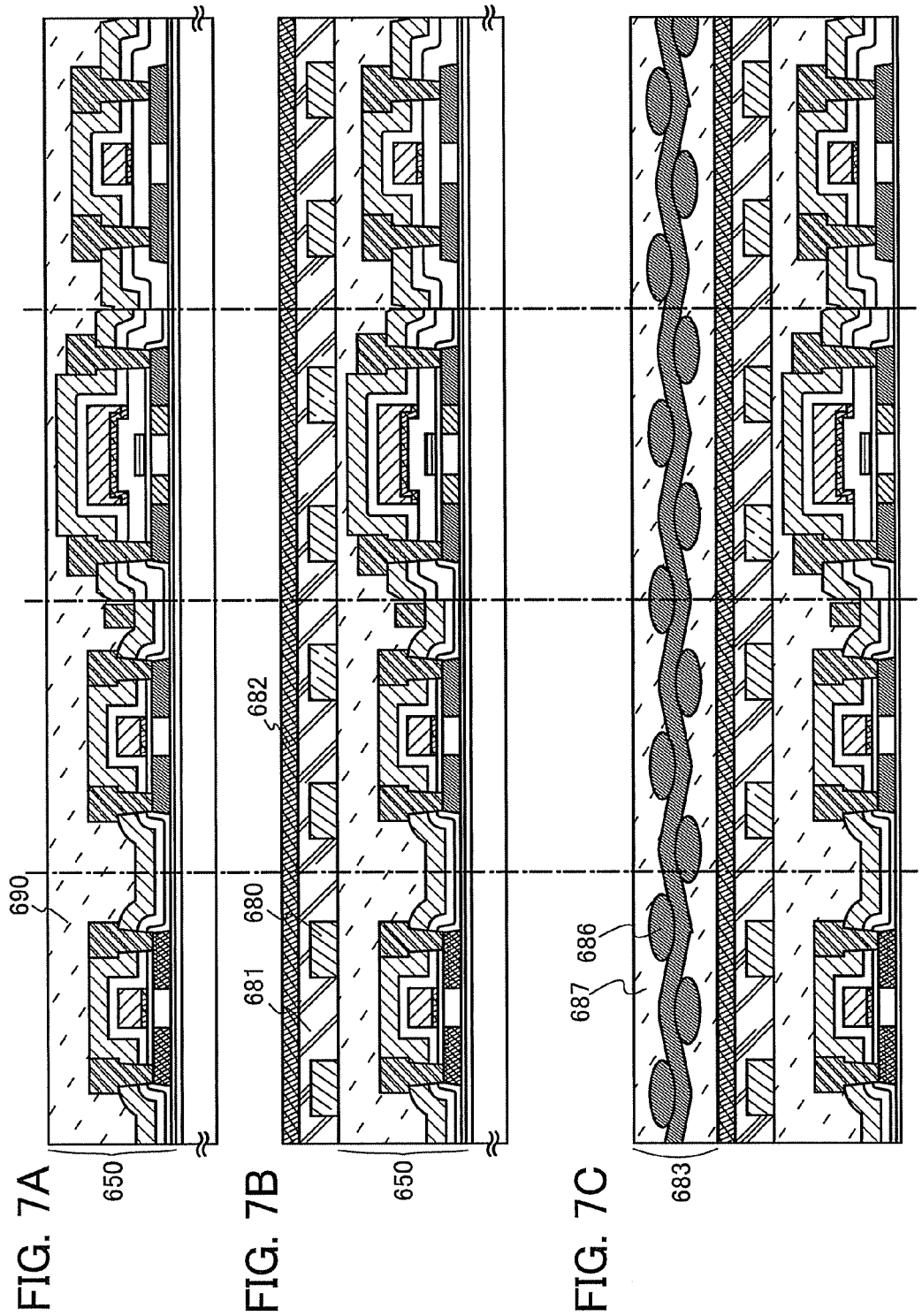

1401

1402

1403

1404

1405

1406

1407

SEMICONDUCTOR DEVICE AND MANUFACTURING METHOD OF THE SAME

TECHNICAL FIELD

The present invention relates to a semiconductor device and a manufacturing method thereof.

BACKGROUND ART

In semiconductor devices which transmit and receive data through antennas by wireless communication (such semiconductor devices are also referred to as non-contact signal processing devices, semiconductor integrated circuit chips, and IC chips), a breakdown (electrostatic breakdown) of the semiconductor devices due to electrostatic discharge (ESD) from the outside is a major problem which may cause reduction in reliability or productivity from the time of manufacturing steps and inspection of the semiconductor devices to the time of using them as products, and countermeasures for the problem has been reported (e.g., see Patent Document 1).

Patent Document 1 discloses an example in which electrostatic breakdown is prevented by using a conductive polymer layer for a substrate and an adhesive agent in the above-described semiconductor devices.

REFERENCE

Patent Document 1

Japanese Published Patent Application No. 2007-241999

DISCLOSURE OF INVENTION

As the market for the above-described semiconductor devices expands, forms and necessary characteristics of the semiconductor devices demanded become diverse. In specific, reduction in size and thickness is strongly demanded as a demand for the form. At the same time, further increase in resistance to the above-described electrostatic breakdown and improvement in strength against an external stress are demanded. Further, it is important to secure, as well as the improvement in the reliability, a function of wireless communication which is a primary function more certainly than conventional semiconductor devices.

In view of the foregoing problem, an object according to one embodiment of the present invention is to provide a semiconductor device whose resistance to electrostatic breakdown is increased or strength for an external stress is improved without failure of a function of wireless communication while reduction in the size and the thickness is achieved. Further, another object is to manufacture a semiconductor device with high yield by preventing a defect in shape and functional operation due to electrostatic breakdown in a manufacturing process. Furthermore, another object is to manufacture a semiconductor device with high productivity at low cost.

A semiconductor device which is one embodiment of the present invention includes a semiconductor integrated circuit, an antenna electrically connected to the semiconductor integrated circuit, a first insulating layer (an insulating layer is also referred to as an insulator) provided over the antenna, a conductive shield provided over the first insulating layer, and a second insulating layer and a third insulating layer which sandwich the top and the bottom of the semiconductor integrated circuit, the antenna, the first insulating layer, and the conductive shield. The second insulating layer and the third insulating layer are firmly stuck to each other at the end portions of the semiconductor device. The periphery of the semiconductor integrated circuit, the antenna, and the first insulating layer is covered with the second insulating layer and the third insulating layer. The semiconductor device which is one embodiment of the present invention is a non-contact signal processing device which has a function of transmitting and receiving a signal to/from an external device by wireless communication. Accordingly, the conductive shield shields the semiconductor integrated circuit in the semiconductor device from application of static electricity from the outside without interrupting electromagnetic waves which should be transmitted and received through the antenna electrically connected to the semiconductor integrated circuit.

A semiconductor device which is one embodiment of the present invention includes a semiconductor integrated circuit, an antenna electrically connected to the semiconductor integrated circuit, a conductive film (also referred to as a conductive shield) provided so as to overlap with the semiconductor integrated circuit with a first insulator provided therebetween, and a second insulator provided so as to sandwich the semiconductor integrated circuit, the antenna, and the conductive film, and to cover the top and bottom and the periphery thereof.

At that time, the second insulator may have a structural body in which a fibrous body is impregnated with a resin.

The conductive film contains metal, metal oxide, semiconductor, or metal nitride.

As the metal film, for example, a titanium film with a thickness of greater than or equal to 5 nm and less than or equal to 100 nm may be used. As the metal oxide film, for example, an indium tin oxide film with a thickness of greater than or equal to 5 nm and less than or equal to 100 nm containing silicon oxide may be used.

Alternatively, as the conductive film, a structural body having a structure in which island-shaped conductors need using metal, metal oxide, semiconductor, or metal nitride are scattered may be used.

The thickness of at least one of the first insulator and the second insulator is preferably greater than or equal to 5 inn and less than or equal to 50 μm The conductive shield diffuses static electricity applied by electrostatic discharge to let it go or prevents local electric charges (localization of electric charges) (prevents local potential difference in the semiconductor device) so that an electrostatic breakdown of the semiconductor integrated circuit can be prevented. The conductive shield is formed so as to cover the top side or the bottom side of the semiconductor integrated circuit with an insulator provided therebetween. Alternatively, the conductive shield is formed so as to cover the semiconductor integrated circuit with the insulator provided therebetween. It is preferable that the conductive shield be electrically isolated from the semiconductor integrated circuit (also referred to as a floating state).

Such a conductive shield limits attenuation of electromagnetic waves, which should be transmitted and received through an antenna electrically connected to the semiconductor integrated circuit the conductive shield covers, to the minimum and blocks static electricity. Accordingly, a semiconductor device which has resistance to electrostatic breakdown without failure of a function of wireless communication can be provided.

Insulators provided so as to sandwich the top and bottom of the semiconductor integrated circuit also function as impact resistance layers against a physical force applied from the outside (such a force is also referred to as an external stress)

or impact diffusion layers for diffusing the force. Since a local force applied on the semiconductor device can be reduced by the insulators, failure of functional operation or damage to the semiconductor device due to an external stress can be prevented.

The semiconductor integrated circuit included in the semiconductor device can be formed by the following manner: the semiconductor integrated circuit is formed over a substrate; one surface of the semiconductor integrated circuit is bonded to an insulator; and the semiconductor integrated circuit is separated from the substrate. In that case, a surface which is exposed on the semiconductor integrated circuit and the substrate by the separation of the semiconductor integrated circuit from the substrate is referred to as a separation surface.

Alternatively, the semiconductor integrated circuit included in the semiconductor device may be directly formed over a flexible substrate. As the flexible substrate, a thin film resin substrate such as a PET film and a PEN film can be given. However, it is needless to say that the flexible substrate is not limited to them.

Further, in this specification, the term "transfer" (also referred to as transpose) indicates to separate a semiconductor integrated circuit formed over a substrate from the substrate and move the semiconductor integrated circuit to another substrate. In other words, the term "transfer" indicates to move a position where the semiconductor integrated circuit is provided to another substrate.

The insulator may be bonded to the semiconductor integrated circuit with the use of a bonding layer. In that case, the bonding layer is between the semiconductor integrated circuit and the insulator. Alternatively, the insulator and the semiconductor integrated circuit may be directly bonded to each other by heating and pressure treatment.

For the conductive shield, a film of metal, metal nitride, metal oxide, or the like, or a stack of any of the films can be used. The thickness of the conductive shield is preferably less than or equal to 1 µm in consideration of balance between the above-described function of wireless communication and capability of shielding static electricity.

The conductive shield may be formed using an element such as titanium, molybdenum, tungsten, aluminum, copper, silver, gold, nickel, platinum, palladium, iridium, rhodium, tantalum, cadmium, zinc, iron, silicon, germanium, zirconium, or barium; or an alloy material, a compound material, a nitride material, an oxide material, or the like, which contains any of the above elements as a main component.

As the nitride material, tantalum nitride, titanium nitride, or the like can be used.

As the oxide material, indium tin oxide (ITO), indium tin oxide containing silicon oxide (ITSO), organoindium, organotin, zinc oxide, or the like can be used. Alternatively, indium zinc oxide (IZO) containing zinc oxide (ZnO), zinc oxide containing gallium (Ga), tin oxide, indium oxide containing tungsten oxide, indium zinc oxide containing tungsten oxide, indium oxide containing titanium oxide, indium tin oxide (ITO) containing titanium oxide, or the like may be used.

Alternatively, a semiconductor film having conductivity, which is obtained by adding an impurity element or the like to a semiconductor, or the like can be used. For example, a polycrystalline silicon film doped with an impurity element such as phosphorus can be used.

Further, as the conductive shield, a conductive macromolecule (also referred to as a conductive polymer) may be used. As the conductive macromolecule, a so-called π-electron conjugated conductive polymer can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive polymer are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), or poly(3-anilinesulfonic acid).

An organic resin or a dopant (a halogen, a Lewis acid, an inorganic acid, an organic acid, a transition metal halide, an organic cyano compound, a nonionic surfactant, and the like) may be contained in the conductive shield containing a conductive macromolecule.

The conductive shield can be formed by a dry process such as a sputtering method, a plasma CVD method, or an evaporation method, or a wet process such as a coating method, a printing method, or a droplet discharge method (inkjet method).

For the insulator, a structural body in which a fibrous body is impregnated with an organic resin can be used, for example.

Alternatively, for the insulator, a material with a low elasticity and a high breaking strength may be used.

As described above, since a property of impact resistance against a physical force applied to the semiconductor device from the outside (such a force is also referred to as an external stress) or a property of impact diffusion for diffusing the force is demanded as a main function of the insulator, the insulator is preferably formed using a high-strength material. As typical examples of a high-strength material, a polyvinyl alcohol resin, a polyester resin, a polyamide resin, a polyethylene resin, an aramid resin, a polyparaphenylene benzobisoxazole resin, a glass resin, and the like can be given. By provision of the insulator formed using a high-strength material having elasticity, a load such as local pressing force is diffused through and absorbed in the whole layer, so that damage of the semiconductor device can be prevented.

In specific, as the insulator, an aramid resin, a polyethylene naphthalate (PEN) resin, a polyether sulfone (PES) resin, a polyphenylene sulfide (PPS) resin, a polyimide (PI) resin, or the like can be used.

More preferably, the semiconductor integrated circuit is sandwiched between the above-described structural bodies in which the fibrous body is impregnated with the organic resin and is further sandwiched between the above-described insulators formed using the resin.

Note that in the present invention, "semiconductor device" indicates general devices which can function using semiconductor properties. A device that has a circuit including a semiconductor element (such as a transistor, a memory element, or a diode), and a semiconductor device such as a chip having a processor circuit can be manufactured as one embodiment of the present invention.

With the use of a conductive shield covering a semiconductor integrated circuit, an electrostatic breakdown (malfunctions of the circuit or damages to a semiconductor element) of the semiconductor integrated circuit due to electrostatic discharge is prevented. Further, with the use of the insulators which sandwich the semiconductor integrated circuit, a highly reliable semiconductor device that is reduced in thickness and size and has resistance to an external stress can be provided. A reason for selectively providing the conductive shield on the antenna side is that electrostatic discharge tends to occur especially in the antenna because the antenna is formed using a conductor with a large surface area. By providing the conductive shield not on the bottom side of the semiconductor integrated circuit but on the antenna side, electrostatic discharge can be prevented more efficiently. Further, as compared to a structure in which the conductive shield is provided so as to cover the semiconductor integrated circuit and the antenna from the both sides, adverse effect on communication capability can be limited to the minimum.

BRIEF DESCRIPTION OF DRAWINGS

FIGS. 6A to 6E are diagrams illustrating a manufacturing method of a semiconductor device which is one embodiment of the present invention.

FIGS. 7A to 7C are diagrams illustrating a manufacturing method of a semiconductor device which is one embodiment of the present invention.

BEST MODE FOR CARRYING OUT THE INVENTION

Figure 1A:
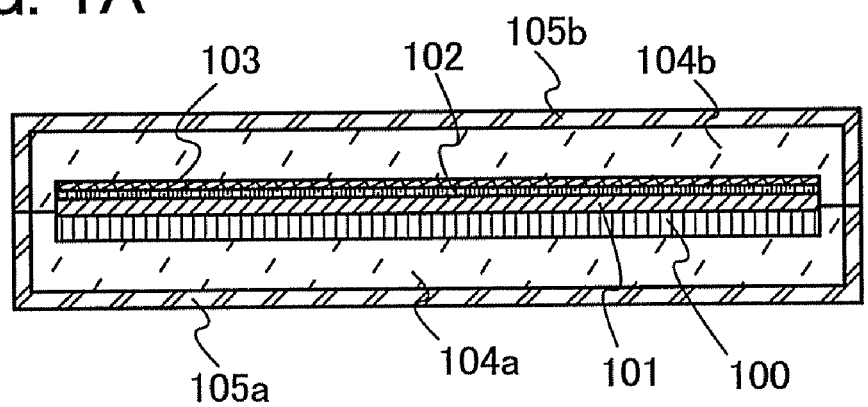
FIGS. 1A and 1B are diagrams each illustrating a semiconductor device which is one embodiment of the present invention.

Embodiments of the present invention will be described with reference to the accompanying drawings. However, the present invention is not limited to the following description, and it is to be easily understood by those skilled in the art that various changes for the modes and details thereof are possible unless such changes depart from the spirit and scope of the invention. Therefore, the present invention should not be interpreted as being limited to what is described in the embodiments described below. Note that in the structures of the present invention described below, identical portions or portions having similar functions are marked by same reference numerals throughout the drawings so as to eliminate repeated explanation.

Embodiment 1

In this embodiment, a semiconductor integrated circuit will be described by exemplifying a semiconductor integrated circuit which is separated from a substrate over which the semiconductor integrated circuit has been formed, and sandwiched between flexible insulators. Note that in this specification, the substrate over which the semiconductor integrated circuit has been formed is also referred to as a formation substrate. Thus, the semiconductor integrated circuit is formed over the formation substrate with a separation layer provided therebetween. However, as described above, a case where the semiconductor integrated circuit is directly formed over the flexible substrate without a separation step and the like is also possible.

Figure 1B:
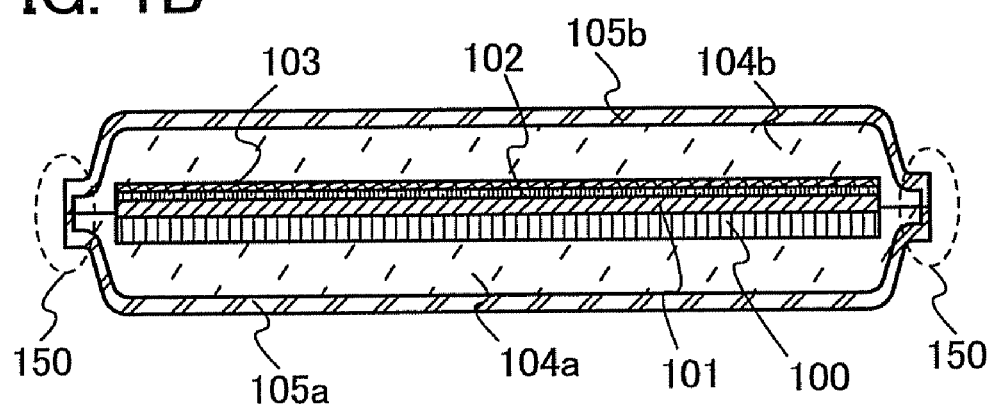

FIGS. 1A and 1B illustrate a semiconductor device of this embodiment. As shown in FIG. 1A, the semiconductor device which is one embodiment of the present invention has a structure in which a conductive shield 103 is provided over a structural body including a semiconductor integrated circuit 100, an antenna 101 electrically connected to the semiconductor integrated circuit 100, and an insulator 102 provided over the antenna 101. Further, the outside of the structure is sandwiched between insulators 104a and 104b and between insulators 105a and 105b. Although FIGS. 1A and 1B show a stack of insulators 104a and 105a and a stack of insulators 104b and 105b as the insulators which interpose the outside of the structure, this embodiment is not limited to this structure. A single layer or a stack of three or more layers may be employed.

The insulators 104a and 105a and the insulators 104b and 105b are provided on the bottom of the semiconductor integrated circuit 100 and over the top of the semiconductor integrated circuit 100, respectively, so as to cover the side surfaces of the semiconductor integrated circuit 100 and be in contact with each other at end portions. In order to form such a structure, the structure may be formed in the following manner: after the semiconductor integrated circuit 100 and the antenna 101 are separated into chip forms, the insulators 104a and 104b and the insulators 105a and 105b sandwich the semiconductor integrated circuit 100 and the antenna 101 in a chip form so as to cover the top and bottom surfaces and side surfaces thereof as shown in FIG. 1A; or the insulators 104a and 105a and insulators 104b and 105b are formed on the bottom of and over the top of the semiconductor integrated circuit 100 and the antenna 101, respectively, in advance, and laser or the like is used for separating the semiconductor integrated circuit 100 and the antenna 101 into chip forms so that the side surfaces thereof are covered with the insulators 104a and 104b and the insulators 105a and 105b, which are melted and fused together due to heat at the time of the separation, at end portions 150 as shown in FIG. 1B.

Although the insulators 104a and 104b and the insulators 105a and 105b are uniformly formed so as to cover the top side, the bottom side, and the side surfaces of the semiconductor integrated circuit in FIG. 1A, the insulators 104a and 104b and the insulators 105a and 105b may be formed in stages depending on a step: an insulator may be formed over the entire surface at one time or may be formed over a top side, a bottom side, and side surfaces separately.

Note that although a bonding surface between the insulators 104a and 104b and a bonding surface between the insulators 105a and 105b are shown by solid lines in FIGS. 1A and 1B for convenience, distinct border surfaces do not actually exist in the case where the same material is used for the insulators.

The semiconductor device in this embodiment is a non-contact signal processing device which has a function of transmitting and receiving a signal to/from an external device by wireless communication. Accordingly, the conductive shield 103 shields the semiconductor integrated circuit 100 in the semiconductor device from application of static electricity from the outside without interrupting electromagnetic waves which should be transmitted and received to/from the antenna 101 included in the semiconductor device. The conductive shield 103 diffuses static electricity applied by electrostatic discharge to let it go or prevents local electric charges (localization of electric charges) (prevents local potential difference) so that an electrostatic breakdown of the semiconductor integrated circuit 100 can be prevented.

In addition, the conductive shield 103 is provided only on the top side of the semiconductor integrated circuit 100 and the antenna 101. Since the antenna 101 is formed using a conductor with a large surface area, electrostatic discharge especially tends to occur. By providing the conductive shield 103 on the antenna 101 side, electrostatic discharge can be prevented more efficiently. Further, since the conductive shield 103 is not provided on a surface on the bottom side of the semiconductor integrated circuit 100, a fine communication function can be secured while adverse effect on transmission and reception of data is limited to the minimum and an electrostatic breakdown is prevented as described above.

In addition, the semiconductor device shown in this embodiment operates by generating an induced electromotive force by electromagnetic waves from the outside (has a wireless function). Accordingly, the conductive shield 103 needs to be formed using a conductive material which prevents a breakdown of the semiconductor integrated circuit 100 due to static electricity and passes electromagnetic waves.

In general, it is known that electromagnetic waves attenuate in a substance. The attenuation of the electromagnetic waves is prominent especially in a conductive material. Thus, in this embodiment, since the conductive shield 103 may have a thickness which is adequate to easily diffuse static electricity, the thickness of the conductive shield 103 may be adequately reduced so as to limit the attenuation of the electromagnetic waves to the minimum.

The thickness of the conductive shield 103 may be determined on the basis of the frequency of an electromagnetic wave used for communication, or the resistivity or the magnetic permeability of a conductive material used.

For example, when the frequency of the electromagnetic wave is set to 13.56 MHz and titanium (resistivity $\rho$: $5.5 \times 10^{-7}$ ($\Omega \cdot m$)) is used for the conductive shield 103, the thickness of the conductive shield 103 is set to at least approximately less than or equal to 100 nm. Accordingly, a breakdown of the semiconductor device due to electrostatic discharge can be suppressed while communication with the outside can be fine.

It is needless to say that a material used for the conductive shield 103 is not limited to titanium. For example, in the case where indium tin oxide containing silicon oxide (also referred to as ITSO), which has higher resistivity than titanium, is used, the conductive shield 103 may be formed to have a thickness of at least approximately less than or equal to 700 nm.

In addition, the lower limit of the thickness of the conductive shield is preferably determined on the basis of resistivity. For example, when the resistivity of a conductive material used for the conductive shield is high, the conductive shield is preferably formed to be thick in order to efficiently diffuse static electricity. If the conductive shield is formed to be too thin using a conductive material with a high resistivity, static electricity cannot be efficiently diffused when electrostatic discharge occurs, whereby there is a possibility of a breakdown of the semiconductor integrated circuit.

Accordingly, in order to efficiently prevent a breakdown of the semiconductor device due to static electricity, the thickness of the conductive shield is preferably determined so as to make the sheet resistance less than or equal to $1.0 \times 10^7$ ohm/square, more preferably less than or equal to $1.0 \times 10^4$ ohm/square, further preferably less than or equal to $1.0 \times 10^2$ ohm/square.

Note that if the sheet resistance of a film for forming the conductive shield 103 is within the above-described range, the film is preferably as thin as possible in order to pass electromagnetic waves.

Note that in the case where titanium or the like having a low resistivity is used as a conductive material, the thickness of the conductive shield 103 may be more than or equal to 5 nm (preferably more than or equal to 10 nm) in consideration of a manufacturing process and the like, even though efficient diffusion of static electricity and suppression of attenuation of an electromagnetic wave can be achieved with a small thickness.

On the other hand, in the case where a compound of silicon oxide and indium tin oxide, which has a comparatively high resistivity, or the like, is used, the thickness of the conductive shield 103 is preferably at least more than or equal to 5 nm, more preferably more than or equal to 5 nm and less than or equal to 100 nm.

By forming the above-described conductive shield 103, it is possible to obtain a semiconductor device in which a breakdown due to electrostatic discharge is efficiently suppressed and communication with the outside can be fine.

Next, a material and the like which can be applied to the structure shown in FIGS. 1A and 1B will be described in detail.

The conductive shield 103 has a structure in which attenuation of an electromagnetic wave which should be transmitted and received to/from the antenna 101 is limited to the minimum and static electricity is blocked. Accordingly, a highly reliable semiconductor device that has resistance to an electrostatic breakdown and can transmit and receive data through an antenna by wireless communication can be provided.

For the conductive shield 103, a film of metal, metal nitride, metal oxide, or the like, or a stack of any of the films can be used. The conductive shield 103 may be formed using, for example, an element selected from titanium, molybdenum, tungsten, aluminum, copper, silver, gold, nickel, platinum, palladium, iridium, rhodium, tantalum, cadmium, zinc, iron, silicon, germanium, zirconium, or barium; or an alloy material, a compound material, a nitride material, or an oxide material each containing any of the above elements as a main component.

As the nitride material, tantalum nitride, titanium nitride, or the like can be used.

As the oxide material, indium tin oxide (ITO), indium tin oxide containing silicon oxide (ITSO), organoindium, organotin, zinc oxide, or the like can be used. Further, indium zinc oxide (IZO) containing zinc oxide (ZnO), zinc oxide containing gallium (Ga), tin oxide, indium oxide containing tungsten oxide, indium zinc oxide containing tungsten oxide, indium oxide containing titanium oxide, indium tin oxide containing titanium oxide, or the like may also be used.

Alternatively, a semiconductor film having conductivity, which is obtained by adding an impurity element or the like to a semiconductor, or the like can be used. For example, a polycrystalline silicon film doped with an impurity element such as phosphorus can be used.

Further, as the conductive shield 103, a conductive macromolecule (also referred to as a conductive polymer) may be used. As the conductive macromolecule, a so-called π-electron conjugated conductive polymer can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive polymer are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), or poly(3-anilinesulfonic acid).

An organic resin or a dopant (a halogen, a Lewis acid, an inorganic acid, an organic acid, a transition metal halide, an organic cyano compound, a nonionic surfactant, and the like) may be contained in the conductive shield 103 formed using a material containing a conductive macromolecule.

The conductive shield 103 can be formed by a dry process such as a sputtering method, a plasma CVD method, or an evaporation method, or a wet process such as a coating method, a printing method, or a droplet discharge method (inkjet method).

Figure 2A:
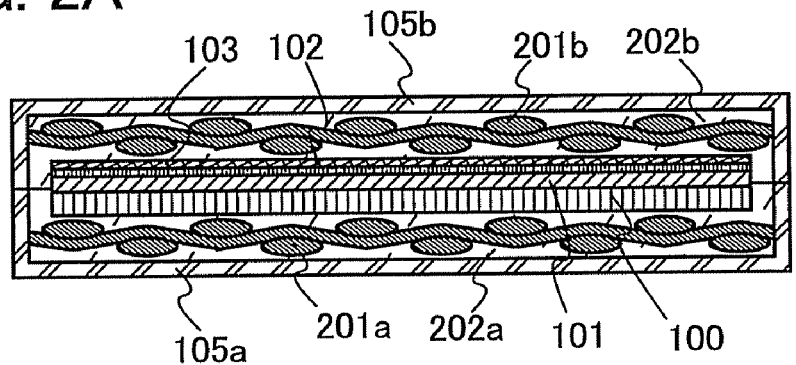
FIGS. 2A to 2C are diagrams each illustrating a semiconductor device which is one embodiment of the present invention.
Figure 2B:
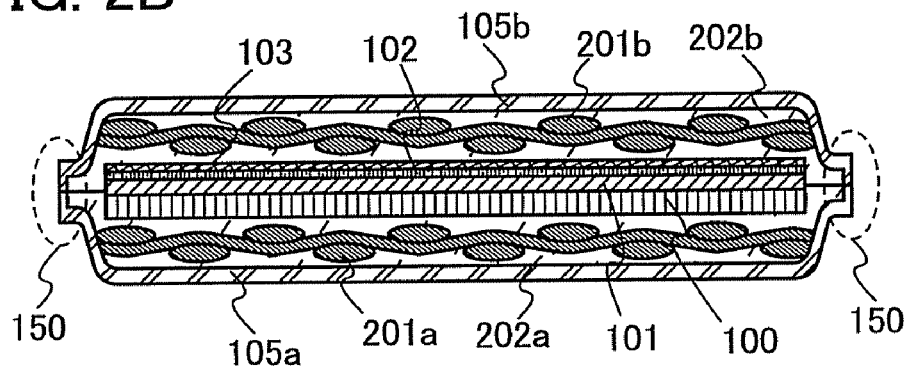
Figure 2C:
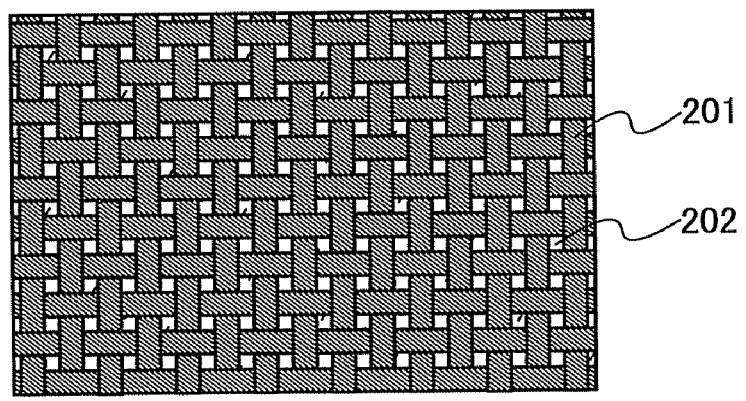

As insulators which sandwich the semiconductor integrated circuit 100 and the antenna 101, a structural body in which a fibrous body is impregnated with an organic resin can be used. FIGS. 2A to 2C show an example of using a structural body in which a fibrous body is impregnated with an organic resin for the insulators 104a and 104b. FIGS. 2A and 2B correspond to FIGS. 1A and 1B.

In FIGS. 2A and 2B, as insulators corresponding to the above-described insulators 104a and 104b, a structural body in which a fibrous body 201a is impregnated with an organic resin 202a and a structural body in which a fibrous body 201b is impregnated with an organic resin 202b are used.

FIG. 2C shows an example of a plan view of a structural body in which a fibrous body is impregnated with an organic resin. As illustrated in the structure in FIG. 2C, the fibrous body 201 is woven using warp yarns spaced at regular intervals and weft yarns spaced at regular intervals. Such a fibrous body which is woven using the warp yarns and the weft yarns has regions without the warp yarns and the weft yarns, that is, a space portion. In the fibrous body 201, a percentage of space portions impregnated with the organic resin 202 is increased, so that adhesiveness between the fibrous body 201 and the semiconductor integrated circuit 100 and the antenna 101 can be strengthened.

Alternatively, in the fibrous body 201, the density of the warp yarns and the weft yarns may be high and a percentage of the space portion may be low. A structural body in which a fibrous body is impregnated with an organic resin is also referred to as a prepreg. The prepreg is a structural body having flexibility in which local depression is reduced. The prepreg is specifically formed in a following manner: after a fibrous body is impregnated with a matrix resin which is diluted with an organic solvent, drying is performed so that the organic solvent is volatilized and the matrix resin is semi-cured. The thickness of the structural body is preferably greater than or equal to 10 μm and less than or equal to 100 μm, preferably greater than or equal to 10 μm and less than or equal to 30 μm. By using a structural body with such a thickness, a thin semiconductor device capable of being curved can be manufactured. As the structural body in which the fibrous body is impregnated with the organic resin, a prepreg having an elasticity of more than or equal to 13 GPa and less than or equal to 15 GPa and a modulus of rupture of approximately 140 MPa can be used.

Note that although the structural body in which the fibrous body is impregnated with the organic resin is a single layer in FIGS. 2A and 2B, a stack of a plurality of layers may be used. In that case, the structural body may be a stack of a plurality of structure bodies in each of which a single layer fibrous body is impregnated with an organic resin or may be a structural body in which a stack of a plurality of fibrous bodies is impregnated with an organic resin. Further, in stacking a plurality of structure bodies in each of which a single layer fibrous body is impregnated with an organic resin, another layer may be sandwiched between the structural bodies.

A thermosetting resin such as an epoxy resin, an unsaturated polyester resin, a polyimide resin, a bismaleimide-triazine resin, or a cyanate resin can be used for the organic resin 202. Alternatively, a thermoplastic resin such as a polyphenylene oxide resin, a polyetherimide resin, or a fluorine resin can be used for the organic resin 202. Further alternatively, a plurality of resins selected from the above-described thermosetting resin and thermoplastic resin may be used as the organic resin 202. By using the above organic resin, the fibrous body can be bonded to the semiconductor integrated circuit by heat treatment. Note that the higher the glass transition temperature of the organic resin 202 is, the less the organic resin 202 is damaged by local pressing force, which is preferable.

Highly thermally-conductive filler may be dispersed in the organic resin 202 or the yarn bundle of the fibrous body. As the highly thermally-conductive filler, aluminum nitride, boron nitride, silicon nitride, alumina, or the like can be given. As the highly thermally-conductive filler, a metal particle such as silver or copper can also be given. When the highly thermally-conductive filler is included in the organic resin or yarn bundles of fibers, heat generated in the semiconductor integrated circuit can be easily released to the outside. Accordingly, thermal storage in the semiconductor device can be suppressed, and a breakdown of the semiconductor device can be reduced.

The fibrous body 201 is a woven or nonwoven fabric using high-strength fibers of an organic compound or an inorganic compound and provided so as to partly overlap with each other. A high-strength fiber is specifically a fiber with a high tensile modulus of elasticity or a fiber with a high Young's modulus. As typical examples of a high-strength fiber, a polyvinyl alcohol fiber, a polyester fiber, a polyamide fiber, a polyethylene fiber, an aramid fiber, a polyparaphenylene benzobisoxazole fiber, a glass fiber, a carbon fiber, and the like can be given. As the glass fiber, a glass fiber using E glass, S glass, D glass, Q glass, and the like can be given. It is to be noted that the fibrous body 201 may be formed from one kind of the above-described high-strength fibers or a plurality of the above-described high-strength fibers.

Further, the fibrous body 201 is formed of a bundle of fibers (single yarn) (such a bundle is hereinafter referred to as a yarn bundle). Although FIG. 2C shows a woven fabric woven by using the fibrous body 201 formed of a yarn bundle as a warp yarn and a weft yarn, an unwoven fabric in which a plural kinds of a yarn bundles of fibers are stacked randomly or in one direction can also be employed. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers which has been subjected to fiber opening with a high-pressure water stream, high-frequency vibration using liquid as a medium, continuous ultrasonic vibration, pressing with a roller, or the like may be used. The yarn bundle of fibers which is subjected to fabric opening has a large width, has a smaller number of single yarns in the thickness direction, and has an elliptical shape or a flat shape in its cross section. Further, by using a loosely twisted yarn as the yarn bundle of fibers, the yarn bundle is easily flattened and has an elliptical shape or a flat shape in cross section. Using a yarn bundle having an elliptical shape or a flat shape in cross section in this manner can reduce the thickness of the fibrous body 201. Accordingly, the thickness of the structural body can be reduced and thus a thin semiconductor device can be manufactured.

Note that in the drawings described in this embodiment, the fibrous bodies 201, 201a, and 201b are shown as a woven fabric which is plain-woven using a yarn bundle having an elliptical shape in cross section.

Further, in order to enhance the permeability of an organic resin into the inside of a yarn bundle of fibers, the fiber may be subjected to surface treatment. For example, as the surface treatment, corona discharge, plasma discharge, or the like for activating a surface of the fiber can be given. Further, surface treatment using a silane coupling agent or a titanate coupling agent can be given.

Alternatively, for the insulators 104a and 104b, a material with a low elasticity and a high breaking strength may be used. For example, a film having a rubber-like elasticity with an elasticity of more than or equal to 5 GPa and less than or equal to 12 GPa and a modulus of rupture of more than or equal to 300 MPa can be used.

The insulators 104a and 104b are preferably formed using a high-strength material. As typical examples of a high-strength material, a polyvinyl alcohol resin, a polyester resin, a polyamide resin, a polyethylene resin, an aramid resin, a polyparaphenylene benzobisoxazole resin, a glass resin, and the like can be given. By providing the insulators 104a and 104b formed using a high-strength material having elasticity, a load such as local pressure is diffused to and absorbed in the entire layer, so that the semiconductor device can be prevented from being damaged.

More specifically, for the insulators 104a and 104b, an aramid resin, a polyethylene naphthalate (PEN) resin, a polyethersulfone (PES) resin, a polyphenylene sulfide (PPS) resin, a polyimide resin (PI), or the like may be used.

In order to bond the semiconductor integrated circuit 100 and the antenna 101 to the insulators 104a and 104b, a bonding layer may be used. The bonding layer is acceptable as long as it can bond the insulators 104a and 104b and the semiconductor integrated circuit 100 and the antenna 101. The bonding layer can be formed using a thermosetting resin, an ultraviolet curable resin, an acrylic resin, an urethane resin, an epoxy resin, a silicone resin, or the like. The thickness of the bonding layer may be approximately more than or equal to 3 μm and less than or equal to 15 μm. In the case where the semiconductor integrated circuit 100 and the antenna 101 are bonded to the insulators 104a and 104b by heat and pressure treatment, the bonding layer is not necessarily used.

Subsequently, a method for manufacturing a semiconductor device which is one embodiment of the present invention is described with reference to FIGS. 3A to 3D.

Figure 3A:
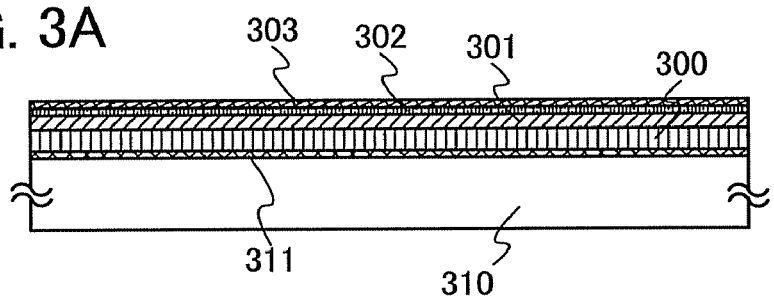
FIGS. 3A to 3D are diagrams illustrating a manufacturing method of a semiconductor device which is one embodiment of the present invention.
Figure 3B:
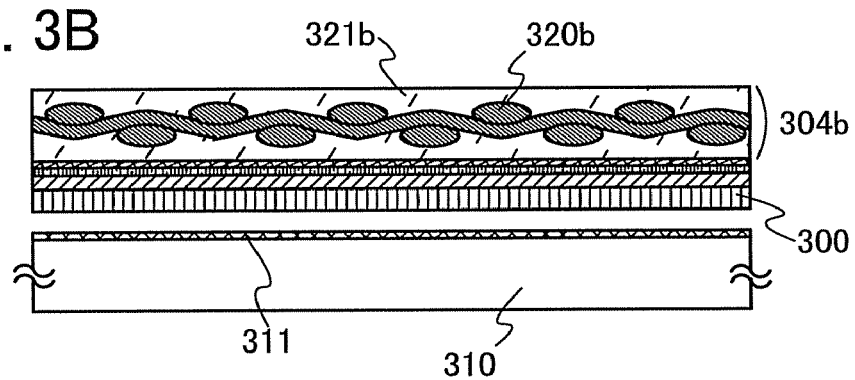
Figure 3C:
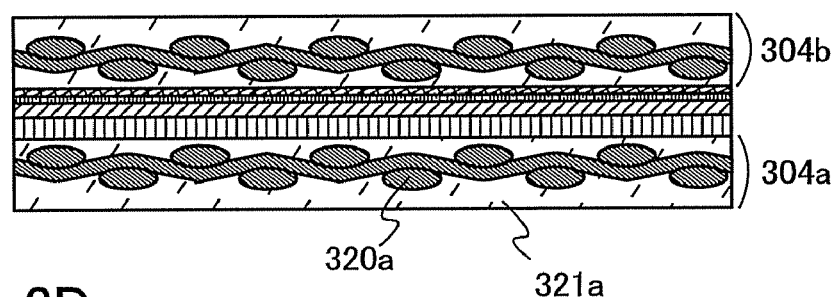

A semiconductor integrated circuit 300, an antenna 301, an insulator 302, and a conductive shield 303 are formed over a substrate 310, which is a formation substrate and has an insulating surface, with a separation layer 311 provided therebetween (see FIG. 3A).

As the substrate 310 which is a formation substrate, a glass substrate, a quartz substrate, a sapphire substrate, a ceramic substrate, a metal substrate having an insulating layer on its surface, or the like can be used. Alternatively, a plastic substrate which can withstand the process temperature of this embodiment may be used. In the manufacturing process of a semiconductor device, a formation substrate can be selected as appropriate in accordance with the process.

The separation layer 311 is formed by a sputtering method, a plasma CVD method, a coating method, a printing method, or the like, so as to have either a single layer structure or a layered structure by using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si); an alloy material containing such an element as a main component; or a compound material containing such elements as a main component. The crystalline structure of a layer containing silicon may be any one of an amorphous state, a microcrystalline state, or a polycrystalline state. Note that the coating method includes a spin-coating method, a droplet discharge method, and a dispensing method in its category here.

When the separation layer 311 has a single layer structure, a tungsten layer, a molybdenum layer, or a layer containing a mixture of tungsten and molybdenum is preferably formed. Alternatively, a layer containing the oxide or oxynitride of tungsten, a layer containing the oxide or oxynitride of molybdenum, or a layer containing the oxide or oxynitride of mixture of tungsten and molybdenum is formed. Note that the mixture of tungsten and molybdenum corresponds to an alloy of tungsten and molybdenum, for example.

If the separation layer 311 has a layered structure, it is preferable that a tungsten layer, a molybdenum layer, or a layer containing a mixture of tungsten and molybdenum be formed as the first layer, and a layer containing an oxide, a nitride, an oxynitride, or a nitride oxide of tungsten, molybdenum, or a mixture of tungsten and molybdenum be formed as the second layer.

If a layered structure of a layer containing tungsten and a layer containing tungsten oxide is formed as the separation layer 311, the layer containing tungsten is formed, and an insulating layer formed from oxide is formed thereover, and a layer containing tungsten oxide in an interface between the tungsten layer and the insulating layer is formed, which may be utilized. Furthermore, a tungsten oxide layer may be formed by performing thermal oxidation treatment, oxygen plasma treatment, treatment with a solution having strong oxidation power such as ozone water, or the like to the surface of the layer containing tungsten. Further, plasma treatment or heat treatment may be performed in an atmosphere of oxygen, nitrogen, or dinitrogen monoxide, or a mixed gas of these gases and another gas. This similarly applies to the case where layers containing nitride, oxynitride, and nitride oxide of tungsten are formed, and after forming a layer containing tungsten, a silicon nitride layer, a silicon oxynitride layer, and a silicon nitride oxide layer may be formed thereover.

In the foregoing process, the separation layer 311 is formed so as to be in contact with the substrate 310. However, a base insulating layer may be formed so as to be in contact with the substrate 310, and the separation layer 311 may be formed so as to be in contact with the insulating layer.

In this embodiment, a titanium film with a thickness of 10 nm (more than 0 µm and less than or equal to 1 µm, preferably more than or equal to 5 nm and less than or equal to 100 nm) is formed by a sputtering method as the conductive shield 303.

After that, a first insulator 304b is bonded over the conductive shield 303 and then, the semiconductor integrated circuit 300, the antenna 301, the insulator 302, and the conductive shield 303 are separated from the substrate 310 by using the separation layer 311 as a border. At that time, the semiconductor integrated circuit 300, the antenna 301, the insulator 302, and the conductive shield 303 are provided on the first insulator 304b side (see FIG. 3B).

In this embodiment, a structural body in which a fibrous body 320b is impregnated with an organic resin 321b is used as the first insulator 304b. A structural body is heated and subjected to pressure bonding so that the organic resin of the structural body is plasticized or cured. In the case where the organic resin is an organic plastic resin, the organic resin which is plasticized is then cured by cooling to room temperature. By heating and pressure bonding, the organic resin is uniformly spread so as to be in close contact with a semiconductor integrated circuit and is cured. A step in which the structural body is subjected to pressure bonding is performed under an atmospheric pressure or a reduced pressure.

Note that a transfer step in which the semiconductor integrated circuit is transferred to another substrate can be performed by using, as appropriate, the following method: a method in which a separation layer is formed between a substrate and a semiconductor integrated circuit, a metal oxide film is provided between the separation layer and the semiconductor integrated circuit, and the metal oxide film is weakened by crystallization, thereby separating the semiconductor integrated circuit; a method in which an amorphous silicon film containing hydrogen is provided between a substrate having high heat resistance and a semiconductor integrated circuit, and the amorphous silicon film is irradiated with a laser beam or etched to remove the amorphous silicon film, thereby separating the semiconductor integrated circuit; a method in which a separation layer is formed between a substrate and a semiconductor integrated circuit, a metal oxide film is provided between the separation layer and the semiconductor integrated circuit, the metal oxide film is weakened by crystallization, part of the separation layer is etched away using a solution or a halogen fluoride gas such as $NF_3$, $BrF_3$, or $ClF_3$, and separation is performed at the weakened metal oxide film; a method in which a substrate over which a semiconductor integrated circuit is formed is mechanically removed or is etched away using a solution or a halogen fluoride gas such as $NF_3$, $BrF_3$, or $ClF_3$; or the like. Alternatively, it is also possible to use a method in which a film containing nitrogen, oxygen, hydrogen, or the like (e.g., an amorphous silicon film containing hydrogen, an alloy film containing hydrogen, or an alloy film containing oxygen) is used as a separation layer, and the separation layer is irradiated with a laser beam so that nitrogen, oxygen, or hydrogen contained in the separation layer is emitted as a gas, thereby promoting separation between a semiconductor integrated circuit and a substrate.

By combining the above-described separation methods, the transferring step can be more easily performed. That is, separation can be conducted with physical force (e.g., by a machine or the like) after making it easier for the separation layer and the semiconductor element layer to be separated from each other by conducting laser beam irradiation, etching the separation layer with a gas or a solution, and/or mechanically removing the separation layer using a keen knife or scalpel.

Alternatively, the semiconductor integrated circuit may be separated from the formation substrate by providing liquid at an interface between the separation layer and the semiconductor integrated circuit.

The structural body is heated and bonded by pressure to an exposed separation surface of the semiconductor integrated circuit 300 to bond a second insulator 304a. Then, the semiconductor integrated circuit 300, the antenna 301, the insulator 302, and the conductive shield 303 are sandwiched between the first insulator 304b and the second insulator 304a (see FIG. 3C).

Like the first insulator 304b, a structural body in which a fibrous body 320a is impregnated with an organic resin 321a is used for the second insulator 304a.

Figure 3D:
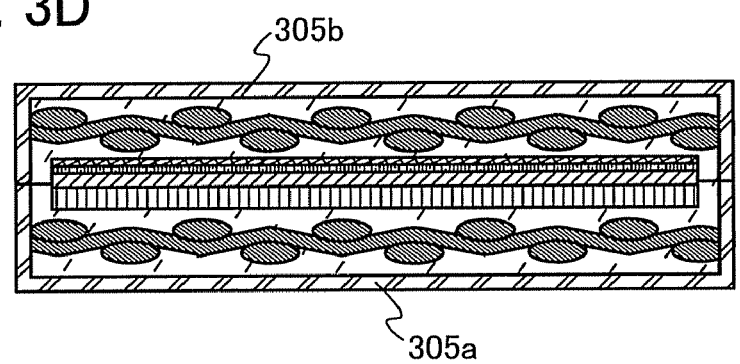

As described above, a third insulator 305b and a fourth insulator 305a may be provided over the top of the first insulator 304b and on the bottom of the second insulator 304a, respectively (see FIG. 3D).

Although not particularly shown, after attaching the first insulator 304b and the second insulator 304a to each other with a plurality of semiconductor integrated circuits 300, antennas 301, insulators 302, and conductive shields 303, which are arranged in the planar direction, sandwiched therebetween, the semiconductor integrated circuits, the antennas, and the conductive shields are separated into individual semiconductor integrated circuit chips. There is no particular limitation on a separation means as long as physical separation is possible, and separation is performed by laser beam irradiation in this embodiment.

By separation with laser light irradiation, the first insulator 304b and the second insulator 304a, and the third insulator 305b and the fourth insulator 305a are melted and fused together at separation surfaces, so that the semiconductor integrated circuit 300, the antenna 301, the insulator 302, and the conductive shield 303 are sealed with the first insulator 304b and the second insulator 304a, and the third insulator 305b and the fourth insulator 305a. As described above, the third insulator 305b and the fourth insulator 305a have an effect of covering the side surfaces of the semiconductor integrated circuit 300 more successfully in this process. If the side surfaces of the semiconductor integrated circuit 300 are covered with the first insulator 304b and the second insulator 304a in an adequately successful manner, this embodiment is not particularly limited to such a structure.

By forming the structure in this manner, the semiconductor integrated circuit 300, the antenna 301, the insulator 302, and the conductive shield 303 are sealed with the first insulator 304b and the second insulator 304a to be protected.

With the use of the conductive shield 303 formed over the semiconductor integrated circuit 300 and the antenna 301, an electrostatic breakdown (malfunctions of the circuit or damages to a semiconductor element) of the semiconductor integrated circuit 300 due to electrostatic discharge is prevented. Further, with the use of a pair of insulators which sandwiches the semiconductor integrated circuit 300, the antenna 301, the insulator 302, and the conductive shield 303 therebetween, a highly reliable semiconductor device that is reduced in thickness and size and has resistance to an external stress can be provided. Further, defects of shapes and characteristics due to an external stress or electrostatic discharge are prevented in the manufacturing process, so that a semiconductor device can be manufactured with high yield.

Embodiment 2

In this embodiment, a highly reliable semiconductor device and a high-yield method for manufacturing a semiconductor device are described in detail with reference to FIGS. 4A and 4B and FIGS. 5A and 5B. In this embodiment, as an example of a semiconductor device, a CMOS (complementary metal oxide semiconductor) will be described.

Figure 4A:
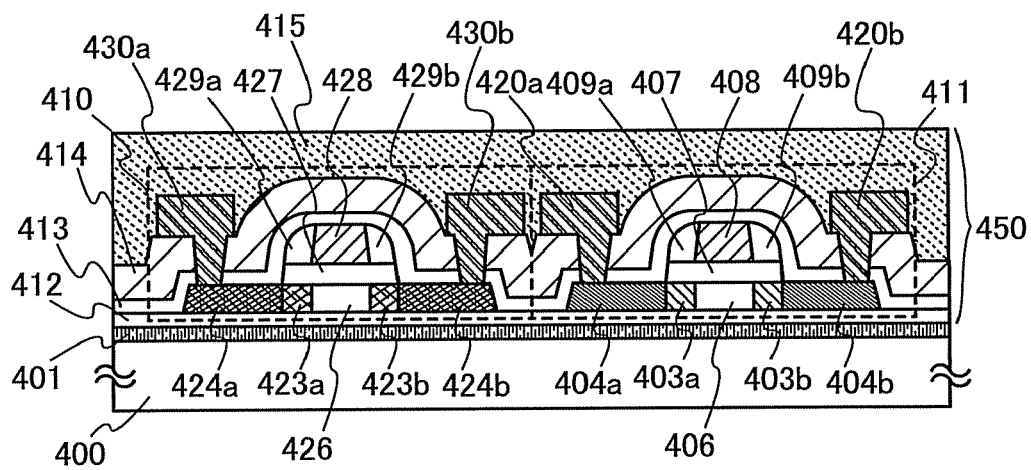
FIGS. 4A and 4B are diagrams illustrating a manufacturing method of a semiconductor device which is one embodiment of the present invention.
Figure 4B:
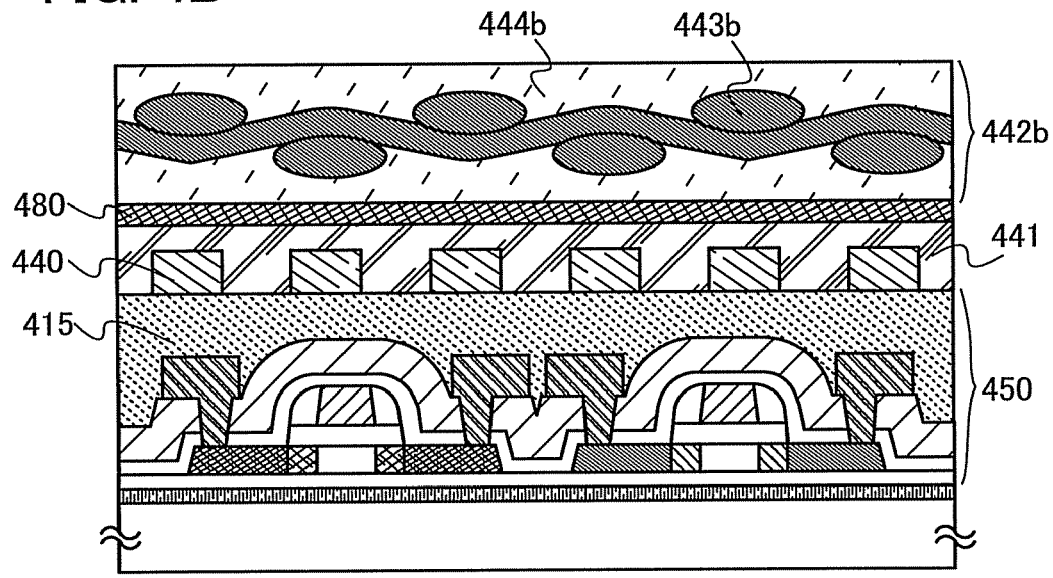

A transistor 410 and a transistor 411, an insulating film 412, an insulating film 413, an insulating film 414, and an insulating film 415 are formed over a substrate 400 having an insulating surface, which is a formation substrate, with a separation layer 401 provided therebetween, whereby a semiconductor integrated circuit 450 is formed (see FIG. 4A).

The transistor 410 is a thin film transistor which includes source and drain regions 424a and 424b, impurity regions 423a and 423b which contain an impurity at lower concentration than the source and drain regions 424a and 424b, a channel formation region 426, a gate insulating layer 427, a gate electrode layer 428, and insulating layers 429a and 429b having a sidewall structure. The source and drain regions 424a and 424b are in contact with wiring layers 430a and 430b serving as source and drain electrode layers, respectively, and electrically connected thereto. In this embodiment, the transistor 410 is a p-channel thin film transistor which contains an Impurity element (e.g., boron (B), aluminum (Al), gallium (Ga), or the like) imparting p-type conductivity to the source and drain regions 424a and 424b and the impurity regions 423a and 423b which are LDD (lightly doped drain) regions.

The transistor 411 is a thin film transistor which includes source and drain regions 404a and 404b, impurity regions 403a and 403b which contain an impurity at lower concentration than the source and drain regions 404a and 404b, a channel formation region 406, a gate insulating layer 407, a gate electrode layer 408, and insulating layers 409a and 409b having a sidewall structure. The source and drain regions 404a and 404b are in contact with wiring layers 420a and 420b serving as source and drain electrode layers, respectively, and electrically connected thereto. In this embodiment, the transistor 411 is an n-channel thin film transistor which contains an impurity element (e.g., phosphorus (P), arsenic (As), or the like) imparting n-type conductivity to the source and drain regions 404a and 404b and the impurity regions 403a and 403b which are LDD regions.

Next, an antenna 440 is formed over the insulating film 415 by using a conductive film. Then, an insulator 441 is formed over the antenna 440. Further, a conductive shield 480 is formed over the insulator 441. In this embodiment, a silicon nitride film which is an inorganic insulating film is used for the insulator 441. Although not shown, the antenna 440 is electrically connected to the semiconductor integrated circuit 450.

Next, an insulator 442b is formed over the conductive shield 480. As the insulator 442b, a structural body in which a fibrous body 443b is impregnated with an organic resin 444b may be used (see FIG. 4B).

The conductive shield 480 and insulator 442b are bonded to each other and then, the semiconductor integrated circuit 450, the antenna 440, the insulator 441, and the conductive shield 480 are separated from the substrate 400 by using the separation layer 401 as an interface. Accordingly, the semiconductor integrated circuit 450 and the antenna 440 are provided on the insulator 442b side (see FIG. 5A).

Figure 5A:
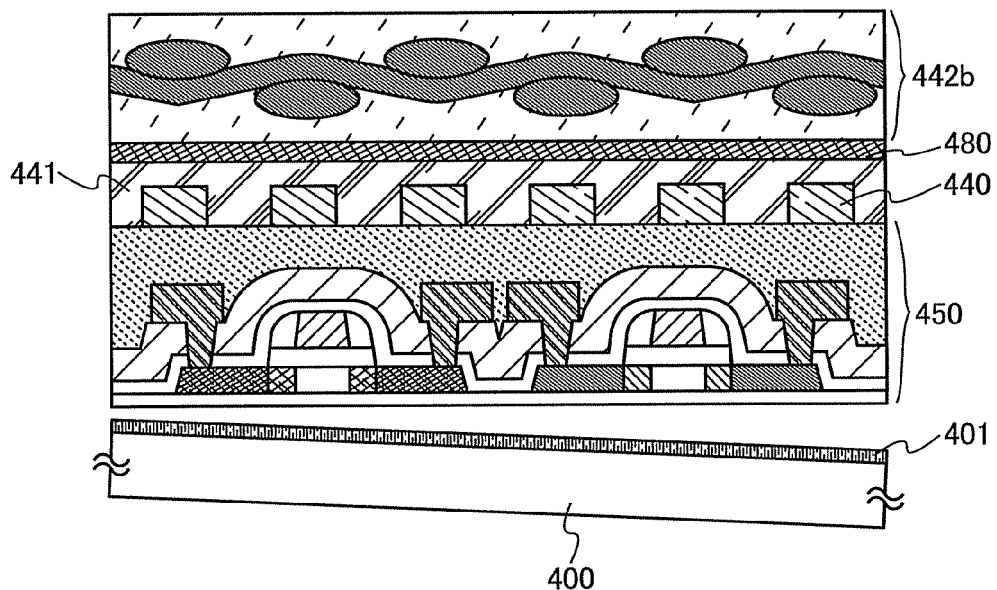
FIGS. 5A and 5B are diagrams illustrating a manufacturing method of a semiconductor device which is one embodiment of the present invention.
Figure 5B:
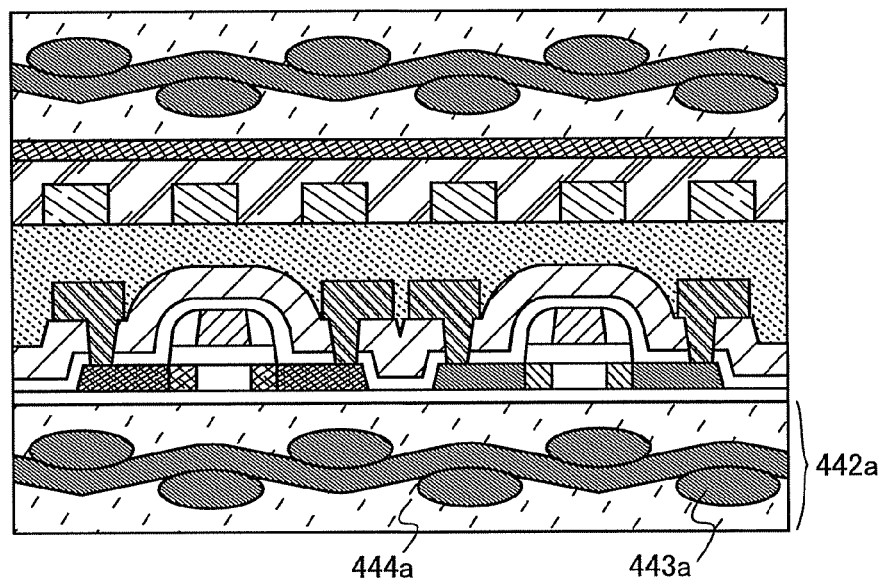

The insulator 442a is bonded by heating a structural body and bonding it by pressure to an exposed separation surface of the semiconductor integrated circuit 450, so that the semiconductor integrated circuit 450, the antenna 440, and the conductive shield 480 are sandwiched between the insulator 442b and the insulator 442a (see FIG. 5B).

Like the insulator 442b, a structural body in which a fibrous body 443a is impregnated with an organic resin 444a may be used for the insulator 442a.

Although not particularly shown, after attaching the insulator 442b and the insulator 442a to each other with semiconductor integrated circuit chips including a plurality of semiconductor integrated circuits 450, antennas 440, insulators 441, and conductive shields 480, which are arranged in the planar direction, sandwiched therebetween, the semiconductor integrated circuits, the antennas, and the conductive shields are separated into the individual semiconductor integrated circuit chips. There is no particular limitation on a separation means as long as physical separation is possible, and separation is performed by laser beam irradiation in this embodiment.

By performing the separation by laser light irradiation, the insulator 442b and the insulator 442a are melted and fused together at separation surfaces, whereby the semiconductor integrated circuit chip is sealed with the insulator 442b and the insulator 442a.

Note that as described in Embodiment 1, an insulator may be further provided outside the insulators 442b and 442a in order to successfully cover the side surface of the semiconductor integrated circuit chip.

By forming a structure in this manner, the semiconductor integrated circuit 450 is sealed with the insulator 442b and the insulator 442a and is protected from electrostatic discharge by the conductive shield 480.

The conductive shield 480 shields the semiconductor integrated circuit 450 in the semiconductor device from application of static electricity from the outside while electromagnetic waves, which should be transmitted and received to/from the antenna 440 included in the semiconductor device, pass through the conductive shield 480. The conductive shield 480 diffuses static electricity applied by electrostatic discharge to let it go or prevents local electric charges (localization of electric charges) (prevents local potential difference) so that an electrostatic breakdown of the semiconductor integrated circuit 450 can be prevented.

Further, since the insulator and the conductive shield are formed so as to sandwich the semiconductor integrated circuit, adverse effects such as damage to and defects in characteristic of the semiconductor integrated circuit due to an external stress or electrostatic discharge can be prevented also in a manufacturing process. Therefore, a semiconductor device can be manufactured with high yield.

By using an insulator having flexibility for the semiconductor device manufactured in this embodiment, the semiconductor device having flexibility can be obtained.

Semiconductor layers included in the transistors 410 and 411 can be formed using any of the following materials: an amorphous semiconductor (hereinafter also referred to as "AS") manufactured by a vapor-phase growth method or a sputtering method using a semiconductor material gas typified by silane or germane; a polycrystalline semiconductor formed by crystallizing the amorphous semiconductor with the use of light energy or thermal energy; a microcrystalline (also referred to as semiamorphous or microcrystal) semiconductor (hereinafter also referred to as "SAS"); or the like. The semiconductor layer can be formed by a sputtering method, an LPCVD method, a plasma CVD method, or the like.

A microcrystalline semiconductor film belongs to a metastable state state which is intermediate between an amorphous state and a single crystal state when Gibbs free energy is considered. That is, the microcrystalline semiconductor film is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 cm$^{-1}$, which represents a peak of the Raman spectrum of single-crystalline silicon. That is, the peak of the Raman spectrum of the microcrystalline silicon exists between 520 cm$^{-1}$ which represents single-crystalline silicon and 480 cm$^{-1}$ which represents amorphous silicon. The semiconductor includes hydrogen or halogen of at least 1 at. % or more to terminate a dangling bond. Moreover, a rare gas element such as helium, argon, krypton, or neon may be included to further promote lattice distortion, so that stability is enhanced and a favorable microcrystalline semiconductor film can be obtained.

The microcrystalline semiconductor film can be formed by a high-frequency plasma CVD method with a frequency of several tens to several hundreds of megahertz or a microwave plasma CVD apparatus with a frequency of 1 GHz or more. The microcrystalline semiconductor film can be typically fainted using a dilution of silicon hydride such as $SiH_4$, $Si_2H_6$, $SiH_2Cl_2$, $SiHCl_3$, $SiCl_4$, or $SiF_4$ with hydrogen. With a dilution of silicon hydride with one or plural kinds of rare gas elements selected from helium, argon, krypton, and neon in addition to and hydrogen, the microcrystalline semiconductor film can be formed. In that case, the flow rate ratio of hydrogen to silicon hydride is set to be 5:1 to 200:1, preferably, 50:1 to 150:1, more preferably, 100:1.

As an example of a typical amorphous semiconductor, hydrogenated amorphous silicon can be given while polysilicon (polycrystalline silicon) or the like can be given as an example of a typical crystalline semiconductor. Polysilicon includes so-called high-temperature polysilicon formed using polysilicon which is formed at processing temperatures of greater than or equal to 800° C. as a main material, so-called low-temperature polysilicon formed using polysilicon which is formed at processing temperatures of less than or equal to 600° C. as a main material, polysilicon formed by crystallization of amorphous silicon by using an element that promotes crystallization or the like, and the like. It is needles to say that as mentioned above, a microcrystalline semiconductor or a semiconductor containing a crystal phase in part of a semiconductor layer may be used.

As a material of the semiconductor, as well as an element of silicon (Si), germanium (Ge), or the like, a compound semiconductor such as GaAs, InP, SiC, ZnSe, GaN, or SiGe can be used. Alternatively, an oxide semiconductor such as zinc oxide (ZnO), tin oxide ($SnO_2$), magnesium zinc oxide, gallium oxide, or indium oxide, an oxide semiconductor formed of any of the above oxide semiconductors, or the like may be used. For example, an oxide semiconductor formed using zinc oxide, indium oxide, and gallium oxide, or a material in which In, Ga, or the like is added to zinc oxide can also be used. In the case of using zinc oxide for the semiconductor layer, a gate insulating layer is preferably formed using $Y_2O_3$, $Al_2O_3$, $TiO_2$, or a stack of any of the above. For the gate electrode layer, the source electrode layer, and the drain electrode layer, ITO, Au, Ti, or the like is preferably used.

When a crystalline semiconductor layer is used as a semiconductor layer, the crystalline semiconductor layer may be formed by a variety of methods (e.g., a laser crystallization method, a thermal crystallization method, a thermal crystallization method using an element that promotes crystallization, such as nickel, and the like). Also, a microcrystalline semiconductor, which is an SAS, can be crystallized by laser light irradiation to increase its crystallinity. When the element that promotes the crystallization is not introduced, prior to irradiating an amorphous silicon film with laser light, the amorphous silicon film is heated at 500° C. for one hour under a nitrogen atmosphere to release hydrogen contained in the amorphous silicon film such that the concentration of hydrogen becomes $1\times10^{20}$ atoms/cm$^3$ or less. This is because the amorphous silicon film containing a large amount of hydrogen is destroyed by laser light irradiation.

There are no particular limitations on a technique for introducing a metal element into an amorphous semiconductor layer as long as a technique is capable of providing the metal element on a surface or the inside of the amorphous semiconductor layer. For example, a sputtering method, a CVD method, a plasma processing method (including a plasma CVD method), an adsorption method, or a method for coating a solution of metal salt, can be used. In the above mentioned processes, the method using a solution is convenient and has an advantage of easily adjusting the concentration of a metal element. In addition, in order to improve the wettability of the surface of the amorphous semiconductor layer to spread an aqueous solution on the entire surface of the amorphous semiconductor layer, an oxide film is preferably formed by UV light irradiation in an oxygen atmosphere, thermal oxidation, treatment using ozone water containing hydroxy radical or hydrogen peroxide solution, or the like.

The crystallization may be performed by adding an element which promotes crystallization (also referred to as a catalyst element or a metal element) to the amorphous semiconductor layer and performing thermal treatment (at 550 to 750° C. for 3 minutes to 24 hours) in a crystallization step in which an amorphous semiconductor layer is crystallized to form a crystalline semiconductor layer. As the element which promotes (helps) crystallization, one or more elements of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element promoting crystallization from the crystalline semiconductor layer, a semiconductor layer containing an impurity element is formed in contact with the crystalline semiconductor layer and is made to function as a gettering sink. As the impurity element, an impurity element imparting n-type, an impurity element imparting p-type, a rare gas element, or the like can be used. For example, one or a plurality of kinds of elements such as phosphorus (P), nitrogen (N), arsenic (As), antimony (Sb), bismuth (Bi), boron (B), helium (He), neon (Ne), argon (Ar), krypton (Kr), and xenon (Xe) can be used. The semiconductor layer containing a rare gas element is formed over the crystalline semiconductor layer containing an element which promotes crystallization, and a thermal treatment (at 550 to 750° C. for 3 minutes to 24 hours) is performed. The element which promotes crystallization in the crystalline semiconductor layer moves into the semiconductor layer containing a rare gas element, and the element which promotes crystallization in the crystalline semiconductor layer is removed or reduced. Then, the semiconductor layer containing a rare gas element, which serves as a gettering sink, is removed.

Thermal treatment and laser light irradiation may be combined to crystallize the amorphous semiconductor layer. Alternatively, one of the thermal treatment and the laser light irradiation may be performed plural times.

Also, a crystalline semiconductor layer may be formed over a substrate directly by a plasma method. Alternatively, a crystalline semiconductor layer may be selectively formed over a substrate by a plasma method.

The gate insulating layer 407 and the gate insulating layer 427 may be formed using silicon oxide or a layered structure of silicon oxide and silicon nitride. The gate insulating layers 407 and 427 may be formed by depositing an insulating film by a plasma CVD method or a low pressure CVD method or may be formed by solid phase oxidation or solid phase nitridation by plasma treatment. This is because a gate insulating layer formed by oxidation or nitridation of a single crystal semiconductor layer by plasma treatment is dense, has high withstand voltage, and is excellent in reliability. For example, a surface of the semiconductor layer is oxidized or nitrided using nitrous oxide ($N_2O$) diluted with Ar by 1 to 3 times (flow ratio) by application of a microwave (2.45 GHz) power of 3 to 5 kW at a pressure of 10 to 30 Pa. By this process, an insulating film of 1 to 10 nm (preferably 2 to 6 nm) thick is formed. Further, nitrous oxide ($N_2O$) and silane ($SiH_4$) are introduced, and a silicon oxynitride film is formed by a vapor deposition method by application of a microwave (2.45 GHz) power of 3 to 5 kW at a pressure of 10 to 30 Pa; accordingly, the gate insulating layer is formed. The combination of the solid phase reaction and the reaction by the vapor deposition method can form a gate insulating layer with a low interface state density and an excellent withstand voltage.

Alternatively, for the gate insulating layers 407 and 427, a high dielectric constant material such as zirconium dioxide, hafnium oxide, titanium dioxide, or tantalum pentoxide may be used. When a high dielectric constant material is used for the gate insulating layers 407 and 427, gate leakage current can be reduced.

Gate electrode layers 408 and 428 can be formed using a CVD method, a sputtering method, a droplet discharge method, or the like. The gate electrode layer may be formed of an element selected from Ag, Au, Cu, Ni, Pt, Pd, Ir, Rh, W, Al, Ta, Mo, Cd, Zn, Fe, Ti, Si, Ge, Zr, and Ba, or an alloy material or a compound material containing the above element as its main component. Alternatively, a semiconductor film typified by a polycrystalline silicon film doped with an impurity element such as phosphorus, an AgPdCu alloy, or the like may be used as the gate electrode layers 408 and 428. Alternatively, a single layer structure or a structure of a plurality of layers may be employed: for example, a two-layer structure of a tungsten nitride film and a molybdenum film. Alternatively, a three-layer structure in which a tungsten film with a thickness of 50 nm, an aluminum-silicon alloy (Al—Si) film with a thickness of 500 nm, and a titanium nitride film with a thickness of 30 nm are sequentially stacked may be employed. In the case where a three-layer structure is employed, tungsten nitride film may be used instead of the tungsten film of a first conductive film. Alternatively, aluminum-titanium alloy (Al—Ti) film may be used instead of the aluminum-silicon alloy (Al—Si) film of a second conductive film. Alternatively, a titanium film may be used instead of the titanium nitride film of a third conductive film.

A light-transmitting material having a light-transmitting property to visible light can also be used for the gate electrode layers 408 and 428. As a light-transmitting conductive material, indium tin oxide (ITO), indium tin oxide containing silicon oxide (ITSO), organic indium, organic tin, zinc oxide, or the like can be used. Alternatively, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

If etching processing is required to form the gate electrode layers 408 and 428, a mask may be formed and dry etching or wet etching may be performed. In the case of dry etching, by using an ICP (inductively coupled plasma) etching method and controlling etching conditions (e.g., the amount of electric power applied to a coiled electrode, the amount of electric power applied to an electrode on a substrate side, or the electrode temperature on the substrate side) as appropriate, the electrode layer can be etched into a tapered shape. Note that as an etching gas, a chlorinated gas such as $Cl_2$, $BCl_3$, $SiCl_4$, and $CCl_4$, a fluorinated gas such as $CF_4$, $SF_6$, and $NF_3$, or $O_2$ may be used as appropriate.

The insulating layers 409a, 409b, 429a, and 429b having a sidewall structure may be formed in a self-aligning manner by forming an insulating layer, which covers the gate electrode layers and the semiconductor layers, and processing the insulating layer by anisotropic etching of an RIE (reactive ion etching) method. Here, there is no particular limitations on the insulating layer, but the insulating layer is preferably formed using silicon oxide which is formed by reacting TEOS (tetraethyl orthosilicate), silane, or the like and oxygen, nitrous oxide, or the like and which has favorable step coverage. The insulating layer can be formed by a thermal CVD method, a plasma CVD method, an atmospheric pressure CVD method, a bias ECRCVD method, a sputtering method, or the like.

Although a single-gate structure is described as the structure of the transistor in this embodiment, a transistor having a multi-gate structure such as a double-gate structure may alternatively be employed. In this case, gate electrode layers may be provided above and below the semiconductor layer or a plurality of gate electrode layers may be provided only on one side (above or below) of the semiconductor layer.

Alternatively, silicides may be provided over the source and drain regions of the transistor. The silicides are formed by forming conductive films over the source and drain regions of the semiconductor layer and reacting silicon in the exposed source and drain regions of the semiconductor layer with the conductive films by heat treatment, a GRTA method, an LRTA method, or the like. The silicide may be formed by laser irradiation or light irradiation with a lamp. As a material of the conductive film which forms the silicide, any of the followings can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like.

The wiring layers 420a, 420b, 430a, and 430b each function as a source electrode layer or a drain electrode layer can be formed by depositing a conductive film by a PVD method, a CVD method, an evaporation method, or the like, and then etching the conductive film such that it has desired shapes. Alternatively, the wiring layer can be formed selectively at a predetermined place by a printing method, an electroplating method, or the like. Further, a reflow method and a damascene method may be used as well. As a material of the wiring layers 420a, 420b, 430a, and 430b, metal such as Ag, Au, Cu, Ni, Pt, Pd, Ir, Rh, W, Al, Ta, Mo, Cd, Zn, Fe, Ti, Zr, or Ba, a semiconductor such as Si or Ge, or an alloy or a nitride thereof can be used. Further, a light-transmitting material can also be used.

As the light-transmitting conductive material, indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like can be used.

Silicon oxide, silicon nitride, silicon oxynitride, aluminum oxide, aluminum nitride, aluminum oxynitride, or another inorganic insulating material can be used for the insulating films 412, 413, 414, and 415.

With the use of a conductive shield covering a semiconductor integrated circuit, an electrostatic breakdown (malfunctions of the circuit or damages to a semiconductor element) of the semiconductor integrated circuit due to electrostatic discharge is prevented. Further, with the use of an insulator which covers the semiconductor integrated circuit, a highly reliable semiconductor device that is reduced in thickness and size and has resistance to an external stress can be provided. Further, defects of shapes and characteristics due to an external stress or electrostatic discharge are prevented in the manufacturing process, so that a semiconductor device can be manufactured with high yield.

In the semiconductor device which is one embodiment of the present invention, as a semiconductor element, not to mention a field-effect transistor, a memory element which uses a semiconductor layer can be employed; accordingly, a semiconductor device which can fulfill functions required for various applications can be manufactured and provided.

Embodiment 3

In this embodiment, an example of a semiconductor device having a memory, as a semiconductor device which has higher reliability, and a manufacturing method thereof will be described with reference to FIGS. 6A to 6E, FIGS. 7A to 7C, and FIGS. 8A and 8B.

A semiconductor device of this embodiment includes a memory including a memory cell array and a driver circuit portion which drives the memory cell array.

A separation layer 601 is formed over a substrate 600 which is a formation substrate and an insulating film 602 serving as a base film is formed over the separation layer 601.

Then, a semiconductor film is formed over the insulating film 602. The semiconductor film may be formed by a method (a sputtering method, an LPCVD method, a plasma CVD method or the like) to be 25 to 200 nm thick (preferably, 30 to 150 nm thick).

In this embodiment, an amorphous semiconductor film is formed over the insulating film 602, and the amorphous semiconductor film is crystallized by laser beam irradiation; accordingly, a semiconductor film that is a crystalline semiconductor film is formed.

The semiconductor film obtained as described above may be selectively doped with the slight amount of impurity elements (boron or phosphorus) for controlling threshold voltage of a thin film transistor. This doping of an impurity element may be performed on an amorphous semiconductor film before a crystallization step. When the amorphous semiconductor film is doped with impurity elements, the impurities can be activated by thermal treatment for crystallization later. Further, a defect and the like generated in doping can be repaired as well.

Next, the semiconductor film is processed into a desired shape using a mask. In this embodiment, after an oxide film formed on the semiconductor film is removed, another oxide film is formed. Then, a photomask is formed, and processing treatment using photolithography is performed, so that semiconductor layers 603, 604, 605, and 606 are formed. For end portions of the semiconductor layers, inclination angles (taper angles) may be provided.

The etching may be carried out by either plasma etching (dry etching) or wet etching. For treating a large-sized substrate, plasma etching is suitable. As an etching gas, a gas containing fluorine or chlorine such as $CF_4$, $NF_3$, $Cl_2$, or $BCl_3$ is used, and an inert gas such as He or Ar may be appropriately added thereto. Alternatively, localized electric discharge is possible when the etching is employed by atmospheric pressure discharge, and thus etching can be performed without forming a mask over an entire substrate.

An insulating film 610 is formed over the semiconductor layer 605. The insulating film 610 may be formed using silicon oxide or a layered structure of silicon oxide and silicon nitride. The insulating film 610 may be formed by deposition of the insulating layer by a plasma CVD method or a low pressure CVD method. It is preferable that the insulating layer be subjected to solid-phase oxidation or solid-phase nitriding by plasma treatment to form the insulating film 610. This is because an insulating layer which is formed through oxidation or nitridation of the semiconductor layer (typically, a silicon layer) by plasma treatment is dense, and has high withstand voltage and high reliability. The insulating film 610 is used as a tunnel insulating layer for injecting charges into a charge accumulation layer 611; therefore, a strong insulating film is preferable. This insulating film 610 is preferably formed to a thickness of 1 nm to 20 nm, and more preferably, 3 nm to 6 nm.

The insulating film 610 is preferably formed by plasma treatment in such a way that, for example, a silicon oxide layer is formed with a thickness of 3 nm to 6 nm over the semiconductor layer by plasma treatment under an oxygen atmosphere, and a nitrogen-plasma-treated layer is formed by treating the surface of the silicon oxide layer with nitrogen plasma under a nitrogen atmosphere. Specifically, first, a silicon oxide layer with a thickness of 3 nm to 6 nm is formed over the semiconductor layer by plasma treatment under an oxygen atmosphere. Then, a nitrogen-plasma-treated layer with a high concentration of nitrogen is formed over the surface or in the vicinity of the surface of the silicon oxide layer by performance of plasma treatment under a nitrogen atmosphere successively. Note that the vicinity of the surface refers to a depth of approximately 0.5 nm to 1.5 nm from a surface of the silicon oxide layer. For example, by conducting plasma treatment under a nitrogen atmosphere, a structure is obtained in which the silicon oxide layer contains 20 to 50 at. % nitrogen in a region from the surface to a depth of about 1 nm.

A surface of a silicon layer as a typical example of the semiconductor layer is oxidized by plasma treatment, whereby a dense oxide layer that has few distortion in an interface can be formed. In addition, through nitridation by plasma treatment of the oxide layer, oxygen on a surface layer portion is substituted for by nitrogen and a nitrogen layer is formed, whereby the layer can be made even denser. Consequently, an insulating layer which is high in withstand voltage can be formed.

In any event, through use of the aforementioned solid phase oxidation or solid phase nitridation by the plasma treatment, even if a glass substrate with a heat resistance temperature of less than or equal to 700° C. is used, an insulating layer similar to a thermal oxidation film that is formed at a temperature of from 950 to 1050° C. can be obtained. Thus, a tunnel insulating layer having high reliability can be formed as the tunnel insulating layer of the nonvolatile memory element.

The charge accumulation layer 611 is formed over the insulating film 610. This charge accumulation layer 611 may be provided as either a single layer or stacked layers.

The charge accumulation layer 611 can be a floating gate formed of a layer or particles of a semiconductor material or conductive material. As the semiconductor material, silicon, silicon germanium, or the like can be given. When silicon is used, amorphous silicon or polysilicon can be used. Further, polysilicon doped with phosphorus can also be used. As the conductive material, an element selected from tantalum (Ta), titanium (Ti), molybdenum (Mo), or tungsten (W); an alloy including the element as a main component; an alloy film in which the element is combined (representatively, a Mo—W alloy film or a Mo—Ta alloy film); or a silicon film having conductivity may be used. Under the conductive layer formed of such a material, a nitride such as tantalum nitride, tungsten nitride, titanium nitride, or molybdenum nitride; or a silicide such as tungsten silicide, titanium silicide, or molybdenum silicide may be formed. Further, a layered structure which includes the above-described semiconductor materials, conductive materials, or the above-described semiconductor material and the conductive material may be employed. For example, a layered structure of a silicon layer and a germanium layer may be used.

Alternatively, the charge accumulation layer 611 may be formed as an insulating material having a trap which holds charges. As a typical example of such materials, a silicon compound or a germanium compound can be given. As the silicon compound, silicon nitride, silicon oxynitride, silicon oxynitride to which hydrogen is added, or the like can be given. As examples of the germanium compound, germanium nitride, germanium nitride to which oxygen is added, germanium oxide to which nitrogen is added, germanium nitride to which oxygen and hydrogen are added, germanium oxide to which nitrogen and hydrogen are added, and the like can be given.

Next, a mask which covers the semiconductor layers 603, 604, and 606 is formed. By using the mask and the charge accumulation layer 611 as masks, an impurity element that imparts n-type conductivity is added to form n-type impurity regions 662*a* and 662*b*. In this embodiment, phosphorus (P) which is an impurity element imparting n-type conductivity is used as the impurity element. Here, the impurity element imparting n-type conductivity is added so that the n-type impurity regions 662*a* and 662*b* contain the n-type impurity element at concentrations of approximately $1 \times 10^{17}$ atoms/cm$^3$ to $5 \times 10^{18}$ atoms/cm$^3$. The mask covering the semiconductor layers 603, 604, and 606 is removed.

An oxide film over the semiconductor layer 606 is removed, and a gate insulating layer 609 covering the semiconductor layer 605, the semiconductor layer 606, the insulating film 610, and the charge accumulation layer 611 is formed. When the gate insulating layer 609 has a large thickness in a memory cell array, the thin film transistor and the memory element can have high resistance against high voltage; accordingly reliability can be improved.

Note that although the gate insulating layer 609 formed over the semiconductor layer 605 serves as a control insulating layer in a memory element which is completed later, the insulating layer 609 formed over the semiconductor layer 606 serves as a gate insulating layer of a thin film transistor. Therefore, the layer is called the gate insulating layer 609 in this specification.

The oxide film over the semiconductor layers 603 and 604 is removed, and a gate insulating layer 608 covering the semiconductor layers 603 and 604 is formed (see FIG. 6A). The gate insulating layer 608 can be formed by a plasma CVD method, a sputtering method, or the like. The gate insulating layer 608 of the thin film transistor provided in the driver circuit portion preferably has a thickness of more than or equal to 1 nm and less than or equal to 10 nm, more preferably, approximately 5 nm. Thinning of the gate insulating layer 608 has an effect of driving the transistor in the driver circuit portion at high speed and low voltage.

The gate insulating layer 608 may be formed using silicon oxide, or with a layered structure of silicon oxide and silicon nitride. The gate insulating layer 608 may be formed by depositing an insulating film by a plasma CVD method or a low pressure CVD method or may be formed by solid phase oxidation or solid phase nitridation by plasma treatment. This is because a gate insulating layer formed by oxidizing or nitriding a semiconductor layer by plasma treatment is dense, and has high dielectric strength and excellent reliability.

As the gate insulating layer 608, a high dielectric constant material may be used. If a high dielectric constant material is used for the gate insulating layer 608, a gate leakage current can be reduced. As the high dielectric constant material, zirconium dioxide, hafnium oxide, titanium dioxide, tantalum pentoxide, or the like can be used. Further, a silicon oxide layer may be formed by solid-phase oxidation by plasma treatment.

Further, a thin silicon oxide film can also be formed by oxidizing the surface of the semiconductor region by a GRTA method, an LRTA method, or the like, thereby forming a thermal oxide film. Note that a rare gas element such as argon is preferably included in a reactive gas and is preferably mixed in the insulating film to be formed in order to form a dense insulating film with few gate leak current at a low film-formation temperature.

Next, a first conductive film with a thickness of 20 nm to 100 nm and a second conductive film with a thickness of 100 nm to 400 nm are stacked as gate electrode layers over the gate insulating layers 608 and 609. The first and second conductive films can be formed by a sputtering method, an evaporation method, a CVD method, or the like. The first and second conductive films may be formed using an element selected from tantalum (Ta), tungsten (W), titanium (Ti), molybdenum (Mo), aluminum (Al), copper (Cu), chromium (Cr), and neodymium (Nd), or an alloy or compound material containing the above material as a main component. A semiconductor film typified by a polycrystalline silicon film doped with an impurity element such as phosphorus or an AgPdCu alloy may also be used as the first conductive film and the second conductive film. Further, the structure of the first conductive film and the second conductive film is not limited to a two-layer structure, but a three-layer structure may also be employed, for example, such that a tungsten film with a thickness of 50 nm, an aluminum-silicon (Al—Si) alloy film with a thickness of 500 nm, and a titanium nitride film with a thickness of 30 nm are sequentially stacked as the first to third conductive films. In the case where a three-layer structure is employed, a tungsten nitride film may be used instead of the tungsten film of the first conductive film. Alternatively, an aluminum-titanium alloy (Al—Ti) film may be used instead of the aluminum-silicon alloy (Al—Si) film of the second conductive film. Alternatively, a titanium film may be used instead of the titanium nitride film of the third conductive film. Alternatively, a single layer structure may be employed. In this embodiment, tantalum nitride is formed to have a thickness of 30 nm for the first conductive film, and tungsten (W) is formed to have a thickness of 370 nm for the second conductive film.

The first conductive film and the second conductive film are etched, and then first gate electrode layers 612, 613, and 614, second gate electrode layers 616, 617, and 618, a first control gate electrode layer 615, and a second control gate electrode layer 619 are formed (see FIG. 6B).

Although this embodiment shows an example in which the first gate electrode layer (a first control gate electrode layer) and the second gate electrode layer (a second control gate electrode layer) are formed so as to have vertical side surfaces, the present invention is not limited to this. Both the first gate electrode layer (the first control gate electrode layer) and the second gate electrode layer (the second control gate electrode layer) may have a tapered shape or one of the first gate electrode layer (the first control gate electrode layer) and the second gate electrode layer (the second control gate electrode layer) may have a tapered shape and the other thereof may have vertical side surfaces through anisotropic etching. The taper angles of the stacked gate electrode layers may be different or the same. With a tapered shape, coverage of a film to be stacked thereover is improved and a defect is reduced, which leads to improve reliability.

The gate insulating layers 608 and 609 may be etched to some extent and thinned (so-called film reduction) by the etching step in forming the gate electrode layers (and the control gate electrode layers).

Next, a mask 621 which covers the semiconductor layer 604 and a mask 663 which covers the semiconductor layers 605 and 606 are formed. An impurity element 620 imparting p-type conductivity is added using the masks 621 and 663, the first gate electrode layer 612, and the second gate electrode layer 616 as masks to form a p-type impurity region 622a and a p-type impurity region 622b. In this embodiment, boron (B) is used as the impurity element. Here, the impurity element is added so that the p-type impurity regions 622a and 622b contain the impurity element that imparts p-type conductivity at a concentration of approximately $1 \times 10^{20}$ atoms/cm$^3$ to approximately $5 \times 10^{21}$ atoms/cm$^3$. In addition, a channel formation region 623 is formed in the semiconductor layer 603 (see FIG. 6C).

The p-type impurity regions 622a and 622b are high concentration p-type impurity regions which function as a source region and a drain region.

Next, a mask 625 which covers the semiconductor layer 603 is formed. An impurity element 624 which imparts n-type conductivity is added using the mask 625, the first gate electrode layer 613, the second gate electrode layer 617, the first gate electrode layer 614, the second gate electrode layer 618, the first control gate electrode layer 615, and the second control gate electrode layer 619 as masks, so that n-type impurity regions 626a, 626b, 664a, 664b, 627a, 627b, 628a, and 628b are formed. In this embodiment, phosphorus (P) is used as the impurity element. Here, the impurity element is added so that the n-type impurity regions 626a, 626b, 627a, 627b, 628a, and 628b contain the impurity element that imparts n-type conductivity at a concentration of approximately $5 \times 10^{19}$ atoms/cm$^3$ to approximately $5 \times 10^{20}$ atoms/cm$^3$. In addition, a channel formation region 629, a channel formation region 630, and a channel formation region 631 are formed in the semiconductor layer 604, the semiconductor layer 605, and the semiconductor layer 606, respectively (see FIG. 6D).

The n-type impurity regions 626a, 626b, 627a, 627b, 628a, and 628b are high concentration n-type impurity regions which serve as source regions and drain regions. On the other hand, the n-type impurity region 664a and the n-type impurity region 664b are low concentration impurity regions which become LDD regions.

The mask 625 is removed by $O_2$ ashing or with a resist stripper, whereby an oxide film is also removed. After that, insulating films, so-called sidewalls, may be formed so as to cover the side surfaces of the gate electrode layers. The sidewall may be formed of an insulating film containing silicon by a plasma CVD method and a low pressure CVD (LPCVD) method.

In order to activate the impurity element, heat treatment, strong light irradiation, or laser light irradiation may be performed. At the same time as the activation, plasma damage to the gate insulating layer and to an interface between the gate insulating layer and the semiconductor layer can be recovered.

Subsequently, the interlayer insulating layer which covers the gate insulating layer and the gate electrode layer is formed. In this embodiment, a layered structure of an insulating film 667 and an insulating film 668 is employed. The insulating films 667 and 668 each may be a silicon nitride film, a silicon nitride oxide film, a silicon oxynitride film, or a silicon oxide film formed by a sputtering method or plasma CVD. Further, another insulating film containing silicon may also be employed to have a single layer structure or a layered structure including three or more layers.

Further, thermal treatment is performed in a nitrogen atmosphere at 300 to 550° C. for 1 to 12 hours, thereby the semiconductor layer is hydrogenated. Preferably, this step is performed at 400 to 500° C. This step is a step of terminating dangling bonds in the semiconductor layer by using hydrogen contained in the insulating film 667 which is the interlayer insulating layer. In this embodiment, heat treatment is pertained at 410° C. for one hour.

The insulating films 667 and 668 can alternatively be formed of a material selected from aluminum nitride, aluminum oxynitride, aluminum nitride oxide containing more nitrogen than oxygen, aluminum oxide, diamond-like carbon (DLC), a nitrogen-containing carbon film (CN), or another substance containing an inorganic insulating material. Alternatively, a siloxane resin may be used. The siloxane resin corresponds to a resin including Si—O—Si bonding.

Subsequently, contact holes (opening portions) which reach the insulating films 667 and 668 and the gate insulating layers 608 and 609 are formed using a resist mask. Etching may be performed once or a plurality of times according to a selection ratio of a material to be used. Through the etching, the insulating films 668 and 667 and the gate insulating layers 608 and 609 are removed, whereby opening portions reaching the p-type impurity regions 622a and 622b and the n-type impurity regions 626a, 626b, 627a, 627b, 628a, and 628b which are source regions and drain regions are formed. Either wet etching or dry etching may be performed, or both wet etching and dry etching may be performed. A hydrofluoric acid-based solution such as a mixed solution of hydrogen fluoride and ammonium fluoride may be used as an etchant of wet etching. As an etching gas, a chlorine based gas typified by $Cl_2$, $BCl_3$, $SiCl_4$, $CCl_4$, or the like, a fluorine based gas typified by $CF_4$, $SF_6$, $NF_3$, or the like, or $O_2$ can be appropriately used. Further, an inert gas may be added to an etching gas to be used. As an inert element to be added, one or a plurality of elements selected from He, Ne, Ar, Kr, and Xe can be used.

A conductive film is formed so as to cover the opening portions and is etched, whereby wiring layers 669a, 669b, 670a, 670b, 671a, 671b, 672a, and 672b each of which is a source electrode layer or a drain electrode layer electrically connected to part of a source region or a drain region are formed. The wiring layers can be formed by forming the conductive film by a PVD method, a CVD method, an evaporation method, or the like, and then, etching the conductive film into a desired shape. In addition, a conductive layer can be selectively formed in a predetermined position by a droplet discharge method, a printing method, an electrolytic plating method, or the like. Further, a reflow method and a damascene method may be used as well. As a material for the source and the drain electrode layers, a metal such as Ag, Au, Cu, Ni, Pt, Pd, Ir, Rh, W, Al, Ta, Mo, Cd, Zn, Fe, Ti, Zr, or Ba, or Si or Ge, an alloy or nitride thereof can be used. Further, a layered structure of these may be used. In this embodiment, titanium (Ti) is formed to be 60 nm thick, titanium nitride is formed to be 40 nm thick, aluminum (Al) is formed to be 700 nm thick, and titanium (Ti) is formed to be 200 nm thick, and then, the layered structure is processed into a desired shape.

Through the above steps, a semiconductor integrated circuit 650 can be formed, which includes, in a driver circuit portion, a thin film transistor 673 which is a p-channel thin film transistor having p-type impurity regions and a thin film transistor 674 which is an n-channel thin film transistor having n-type impurity regions; and in a memory cell array, a memory element 675 having n-type impurity regions and a thin film transistor 676 which is an n-channel thin film transistor having n-type impurity regions (see FIG. 6E)

In this embodiment, an insulating layer 690 is formed over the semiconductor integrated circuit 650 (see FIG. 7A). Next, a conductive layer 680 that serves as an antenna is formed over the insulating layer 690, and an insulator 681 is formed as a protective layer over the conductive layer 680. Further, a conductive shield 682 is formed over the insulator 681 (see FIG. 7B).

As the insulator 683, a structural body in which a fibrous body 686 is impregnated with an organic resin 687 is used. The structural body is heated and bonded to the semiconductor integrated circuit 650, the conductive layer 680, the insulator 681, and the conductive shield 682 by pressure. Then, the semiconductor integrated circuit 650, the conductive layer 680, the insulator 681, and the conductive shield 682 are separated from the substrate 600 by using the separation layer 601 as an interface. Accordingly, the semiconductor integrated circuit 650, the conductive layer 680, the insulator 681, and the conductive shield 682 are provided on the insulator 683 side (see FIG. 7C).

Figure 8A:
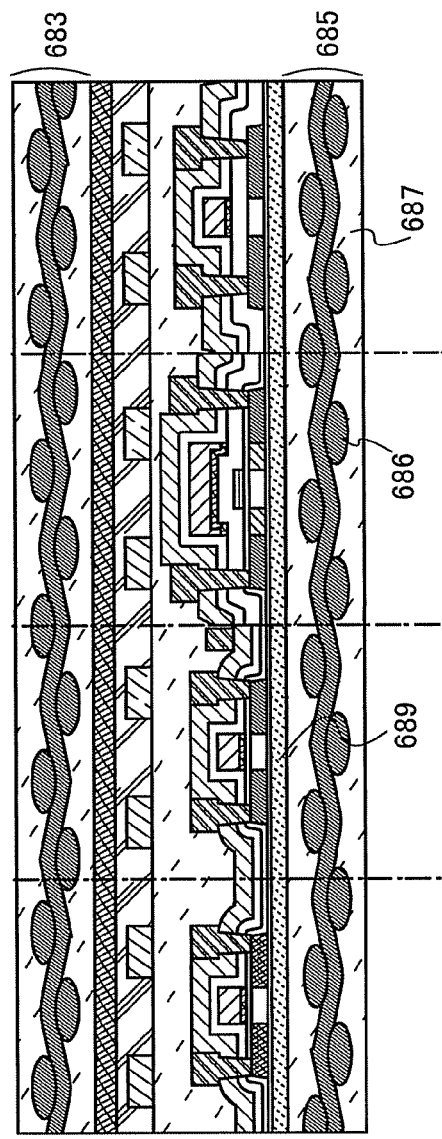
FIGS. 8A and 8B are diagrams illustrating a manufacturing method of a semiconductor device which is one embodiment of the present invention.

A bonding layer 689 is formed on an exposed separation surface of the semiconductor integrated circuit 650, and the semiconductor integrated circuit 650, the conductive layer 680, the insulator 681, and the conductive shield 682 are sandwiched between an insulator 683 and an insulator 685 (see FIG. 8A).

Like the insulator 683, a structural body in which a fibrous body 686 is impregnated with an organic resin 687 is used as the insulator 685.

Although not particularly shown, after attaching the insulators 683 and 685 to each other with semiconductor integrated circuit chips including a plurality of semiconductor integrated circuits 650, conductive layers 680, insulators 681, and conductive shields 682, which are arranged in the planar direction, sandwiched therebetween, the semiconductor integrated circuits, the antennas, and the conductive shields are separated in to the individual semiconductor integrated circuit chips. There is no particular limitation on a separation means as long as physical separation is possible, and separation is performed by laser beam irradiation in this embodiment.

By performing the separation by laser light irradiation, the insulator 683 and the insulator 685 are melted and fused together at separation surfaces, whereby the semiconductor integrated circuit chip is sealed with the insulator 683 and the insulator 685.

Figure 8B:
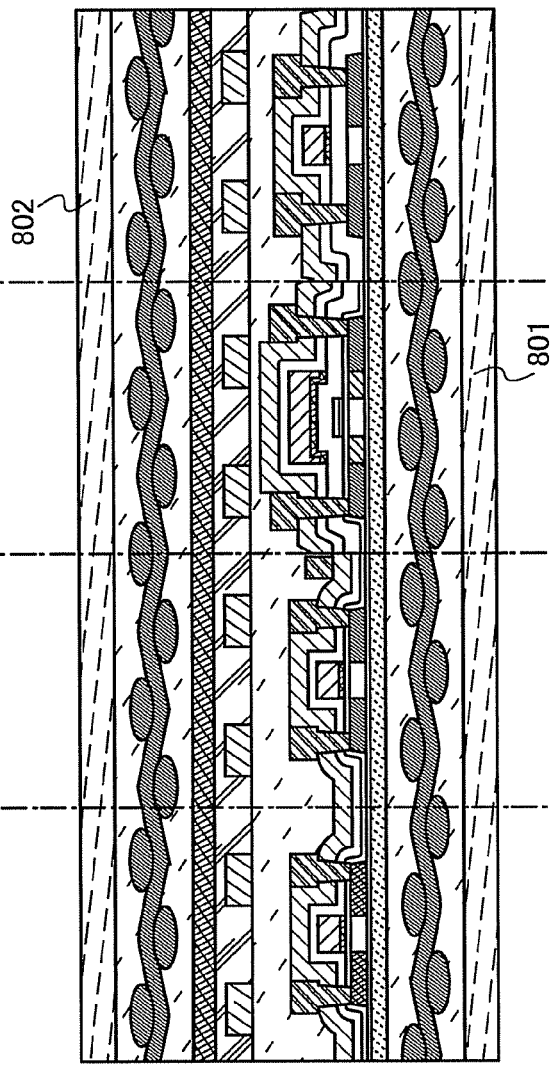

Note that as described in Embodiment 1, insulators 801 and 802 may be further provided outside the insulators 683 and 685 in order to certainly cover the side surface of the semiconductor integrated circuit chip (see FIG. 8B).

By forming a structure in this manner, the semiconductor integrated circuit 650 is sealed with the insulator 683 and the insulator 685 or the insulators 683 and 685 and the insulators 801 and 802 and is protected from electrostatic discharge by the conductive shield 682 which is provided on the top side of the conductive layer 680 serving as an antenna.

The conductive shield 682 shields the semiconductor integrated circuit 650 in the semiconductor device from application of static electricity from the outside without interrupting electromagnetic waves which should be transmitted and received to/from the conductive layer 680 serving as the antenna included in the semiconductor device. The conductive shield 682 diffuses static electricity applied by electrostatic discharge to let it go or prevents local electric charges (localization of electric charges) (prevents local potential difference) so that an electrostatic breakdown of the semiconductor integrated circuit 650 can be prevented.

Further, since the insulators are formed so as to sandwich the semiconductor integrated circuit, adverse effects such as damage and defects in characteristic of the semiconductor integrated circuit due to an external stress or electrostatic discharge can be prevented also in a manufacturing process. Therefore, a semiconductor device can be manufactured with high yield.

With the use of a conductive shield covering a semiconductor integrated circuit, an electrostatic breakdown (malfunctions of the circuit or damages to a semiconductor element) due to electrostatic discharge of the semiconductor integrated circuit is prevented. Further, with the use of the pair of insulators which sandwich the semiconductor integrated circuit, a highly reliable semiconductor device that is reduced in thickness and size and has resistance to an external stress can be provided. Further, defects of shapes and characteristics due to an external stress or electrostatic discharge are prevented in the manufacturing process, so that a semiconductor device can be manufactured with high yield.

By using an insulator having flexibility for the semiconductor device manufactured in this embodiment, the semiconductor device having flexibility can be obtained.

Embodiment 4

In this embodiment, an example of a semiconductor device aimed at having higher reliability is described. Specifically, as examples of the semiconductor device, examples of a microprocessor and a semiconductor device which has an arithmetic function and can transmit and receive data without contact are described.

Figure 9:
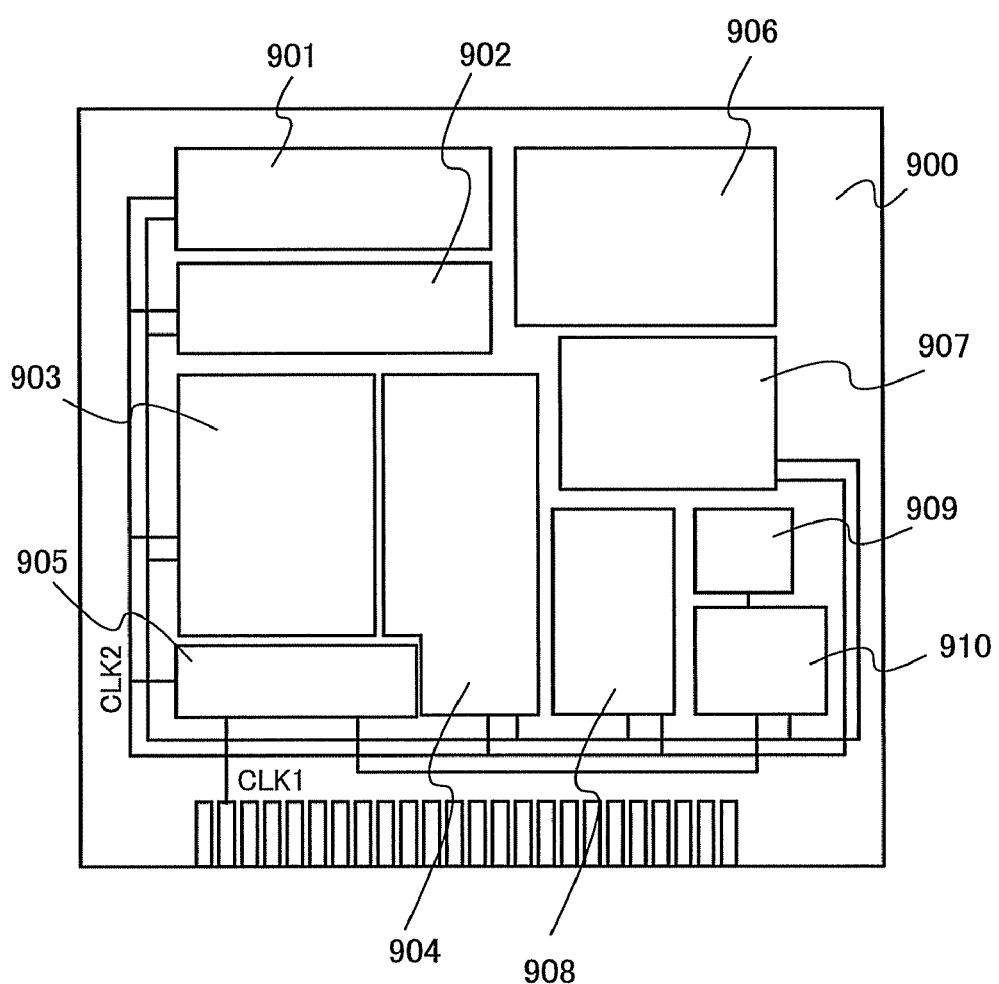
FIG. 9 is a diagram illustrating a structure of a semiconductor device which is one embodiment of the present invention.

FIG. 9 illustrates an example of a microprocessor 900 as an example of the semiconductor device. This microprocessor 900 is manufactured by using the semiconductor device according to any of the above-described embodiments. The microprocessor 900 includes an arithmetic logic unit (also referred to as ALU) 901, an ALU controller 902, an instruction decoder 903, an interrupt controller 904, a timing controller 905, a register 906, a register controller 907, a bus interface (Bus I/F) 908, a read only memory 909, and a memory interface (ROM I/F) 910.

An instruction input to the microprocessor 900 through the bus interface 908 is input to the instruction decoder 903 and decoded therein. Then, the instruction is input to the ALU controller 902, the interrupt controller 904, the register controller 907, and the timing controller 905. The ALU controller 902, the interrupt controller 904, the register controller 907, and the timing controller 905 perform a variety of controls based on the decoded instruction. Specifically, the ALU controller 902 generates signals to control operation of the ALU 901. The interrupt controller 904 judges an interrupt request from an external input/output device or a peripheral circuit based on its priority or a mask state, and processes the request while a program is executed in the microprocessor 900. The register controller 907 generates an address of the register 906, and reads and writes data from/to the register 906 in accordance with the state of the microprocessor 900. The timing controller 905 generates signals for controlling timing of operation of the ALU 901, the ALU controller 902, the instruction decoder 903, the interrupt controller 904, and the register controller 907. For example, the timing controller 905 is provided with an internal clock generator for generating an internal clock signal CLK2 based on a reference clock signal CLK1, and supplies the internal clock signal CLK2 to each of the above-mentioned circuits. Note that FIG. 9 illustrates a mere example of the simplified structure of the microprocessor 900, and practical microprocessors can be provided with various structures depending on the usage.

Figure 10:
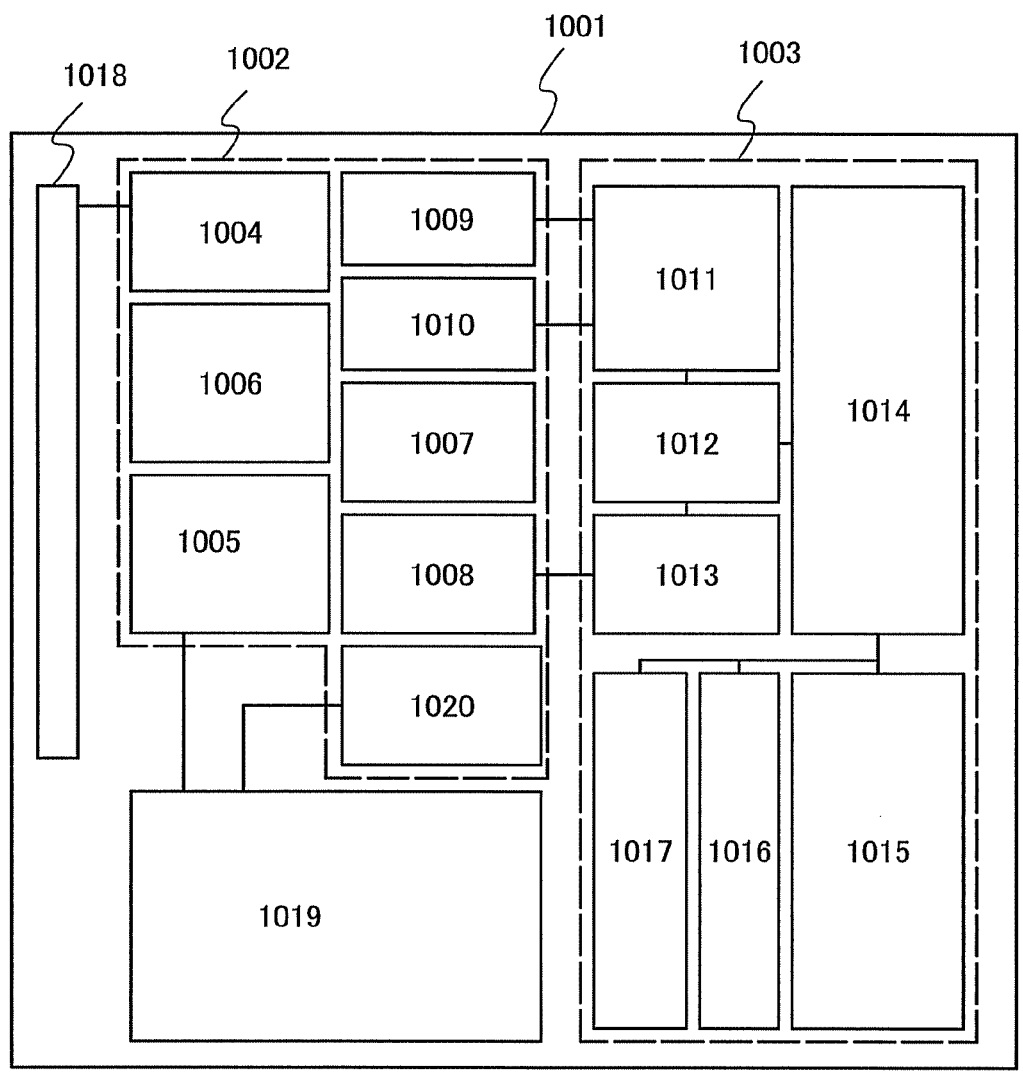
FIG. 10 is a diagram illustrating a structure of a semiconductor device which is one embodiment of the present invention.

Next, an example of a semiconductor device provided with an arithmetic function by which data can be transmitted/received without contact will be described with reference to FIG. 10. FIG. 10 illustrates an example of a computer which operates to transmit and receive signals to/from an external device by wireless communication (such a computer is hereinafter referred to as an "RFCPU"). An RFCPU 1001 has an analog circuit portion 1002 and a digital circuit portion 1003. The analog circuit portion 1002 has a resonance circuit 1004 with a resonance capacitor, a rectifier circuit 1005, a constant voltage circuit 1006, a reset circuit 1007, an oscillator circuit 1008, a demodulation circuit 1009, and a modulation circuit 1010. The digital circuit portion 1003 includes an RF interface 1011, a control register 1012, a clock controller 1013, an interface 1014, a central processing unit (CPU) 1015, a random access memory (RAM) 1016, and a read only memory (ROM) 1017.

An example of the operation of the RFCPU 1001 having such a configuration is as follows. The resonance circuit 1004 generates an induced electromotive force based on a signal received by an antenna 1018. The capacitor portion 1019 is charged with the induced electromotive force via the rectifier circuit 1005. This capacitor portion 1019 is preferably formed using a capacitor such as a ceramic capacitor or an electric double layer capacitor. The capacitor portion 1019 is not necessarily formed over the same substrate as the RFCPU 1001 and may be attached, as another component, to a substrate having an insulating surface that partially constitutes the RFCPU 1001.

The reset circuit 1007 generates a signal that resets and initializes the digital circuit portion 1003. For example, the reset circuit 1007 generates a signal which rises after rise in the power supply voltage with delay as a reset signal. The oscillator circuit 1008 changes the frequency and duty ratio of a clock signal in response to a control signal generated by the constant voltage circuit 1006. The demodulation circuit 1009 having a low pass filter, for example, binarizes changes in amplitude of reception signals of an amplitude shift keying (ASK) system. The modulation circuit 1010 changes the amplitude of transmission signals of an amplitude shift keying (ASK) system to be transmitted. The modulation circuit 1010 changes the resonance point of the resonance circuit 1004, thereby changing the amplitude of communication signals. The clock controller 1013 generates a control signal for changing the frequency and duty ratio of a clock signal in accordance with the power supply voltage or a consumption current of the central processing unit (CPU) 1015. The power supply voltage is monitored by a power supply control circuit 1020.

A signal input from the antenna 1018 to the RFCPU 1001 is demodulated in the demodulation circuit 1009. After that, the signal is decomposed into a control command, data, and the like in the RF interface 1011. The control command is stored in the control register 1012. The control command includes reading of data stored in the read only memory (ROM) 1017, writing of data to the random access memory (RAM) 1016, an arithmetic instruction to the central processing unit (CPU) 1015, and the like. The central processing unit (CPU) 1015 accesses the read only memory (ROM) 1017, the random access memory (RAM) 1016, and the control register 1012 via the interface 1014. The interface 1014 has a function of generating an access signal for any of the read only memory (ROM) 1017, the random access memory (RAM) 1016, and the control register 1012 based on a request from the central processing unit (CPU) 1015.

As an arithmetic method of the central processing unit (CPU) 1015, a method may be employed in which the read only memory (ROM) 1017 stores an OS (operating system) program and a program is read and executed at the time of starting operation. Alternatively, a method in which a circuit dedicated to arithmetic is formed and an arithmetic process is conducted using hardware may be employed. As for a method in which both hardware and software are used, a method can be employed in which part of arithmetic process is conducted in the circuit dedicated to arithmetic and the other part of the arithmetic process is conducted by the central processing unit (CPU) 1015 using a program.

Also in the microprocessor in this embodiment, by the conductive shield covering the semiconductor integrated circuit, an electrostatic breakdown (malfunctions of the circuit or damages to a semiconductor element) due to electrostatic discharge of the semiconductor integrated circuit can be prevented. Further, with the use of the pair of insulators which sandwiches the semiconductor integrated circuit, a highly reliable semiconductor device that is reduced in thickness and size and has resistance to an external stress can be provided. Further, defects of shapes and characteristics due to an external stress or electrostatic discharge are prevented in the manufacturing process, so that a semiconductor device can be manufactured with high yield.

Embodiment 5

In this embodiment, examples of usage modes of the semiconductor device shown in the above embodiment will be described. Specifically, an application example of a semiconductor device to/from which data can be input and output without contact is described with reference to drawings. The semiconductor device capable of inputting and outputting data without contact is also referred to as an RFID tag, an ID tag, an IC tag, an IC chip, an RF tag, a wireless tag, an electronic tag, or a wireless chip.

One example of a top structure of a semiconductor device described in this embodiment is described with reference to FIGS. 11A to 11C. The semiconductor device shown in FIG. 11A includes a semiconductor integrated circuit chip 1100 provided with an antenna (also denoted as an integrated antenna) and a supporting substrate 1106 provided with an antenna 1105 (also denoted as a booster antenna). The semiconductor integrated circuit chip 1100 is provided over an insulating layer 1104 which is formed over the supporting substrate 1106 and the antenna 1105.

Elements such as a plurality of transistors included in a memory portion or a logic portion are provided in a semiconductor integrated circuit which is provided in the semiconductor integrated circuit chip 1100. In the semiconductor device according to this embodiment, as a semiconductor element, not to mention a field-effect transistor, a memory element which uses a semiconductor layer, or the like can be employed; accordingly, a semiconductor device which can fulfill functions required for various applications can be manufactured and provided.

Next, a structure and arrangement of the semiconductor integrated circuit chip 1099 and the antenna 1105 will be described. FIG. 11B is a perspective view of a semiconductor device in which the semiconductor integrated circuit chip 1100 and the antenna 1105 formed over the supporting substrate 1106, which are shown in FIG. 11A, are stacked. FIG. 11C is a cross-sectional view of FIG. 11B along dashed line X-Y.

Figure 11A:
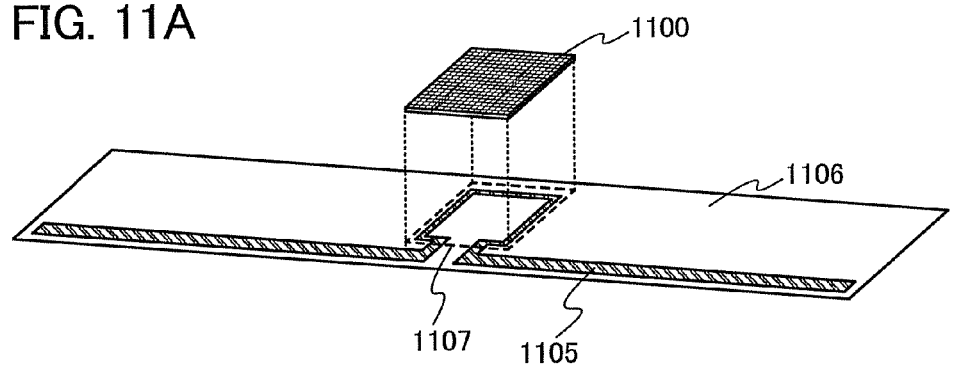
FIGS. 11A to 11C are diagrams illustrating a manufacturing method of a semiconductor device which is one embodiment of the present invention.
Figure 11B:
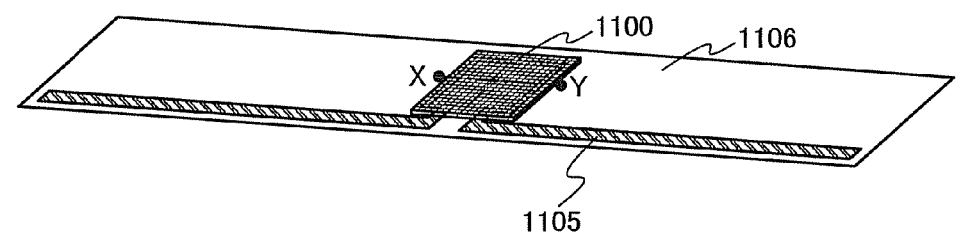
Figure 11C:
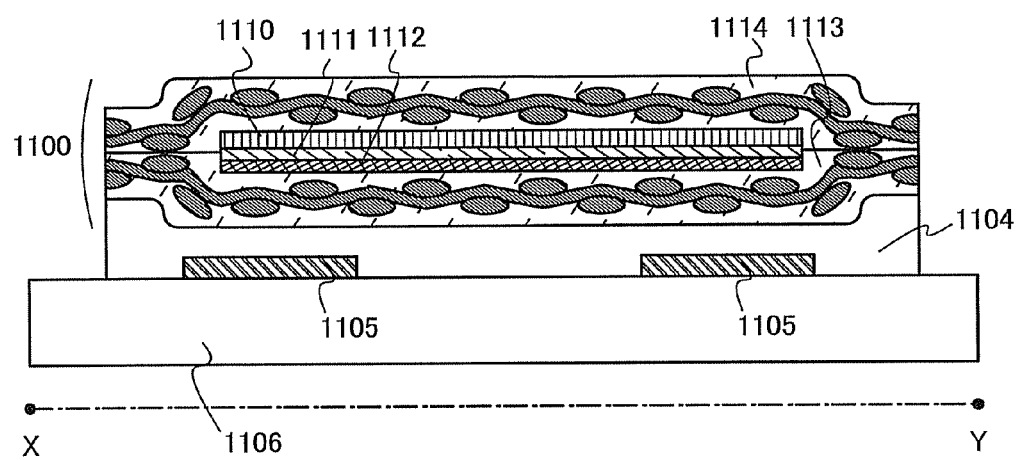

A semiconductor integrated circuit 1110, a conductive layer 1111 serving as an antenna, and a conductive shield 1112 in FIG. 11C are sandwiched between insulators 1113 and 1114. The side surfaces of the semiconductor integrated circuit 1110, the conductive layer 1111, and the conductive shield 1112 are also covered with the insulators 1113 and 1114. Although not particularly shown, the semiconductor integrated circuit 1110 and the conductive layer 1111 serving as the antenna are electrically connected to each other, and an insulator is provided between the conductive layer 1111 serving as the antenna and the conductive shield 1112 so as not to directly connect them to each other. In this embodiment, after the insulators 1113 and 1114 are attached to each other with a plurality of semiconductor integrated circuits 1110, conductive layers 1111, and conductive shields 1112 sandwiched therebetween, the semiconductor integrated circuits are separated into individual semiconductor integrated circuits, whereby the semiconductor integrated circuit chip 1100 is formed. There is no particular limitation on a separation means as long as physical separation is possible. By performing the separation by laser light irradiation, the insulators 1113 and 1114 are melted and fused together at separation surfaces, whereby the side surfaces of the semiconductor integrated circuit 1110 can be successfully sealed with the insulators 1113 and 1114.

The semiconductor device which is one embodiment of the present invention includes the semiconductor integrated circuit 1110, the conductive layer 1111 serving as an antenna, and the conductive shield 1112 which is provided between the insulators 1113 and 1114 (on the semiconductor integrated circuit side or the opposite side thereof). Electromagnetic waves which should be transmitted and received to/from the antenna included in the semiconductor device pass through the conductive shield 1112, and the conductive shield 1112 shields the semiconductor integrated circuit in the semiconductor device from application of static electricity from the outside.

Figure 12A:
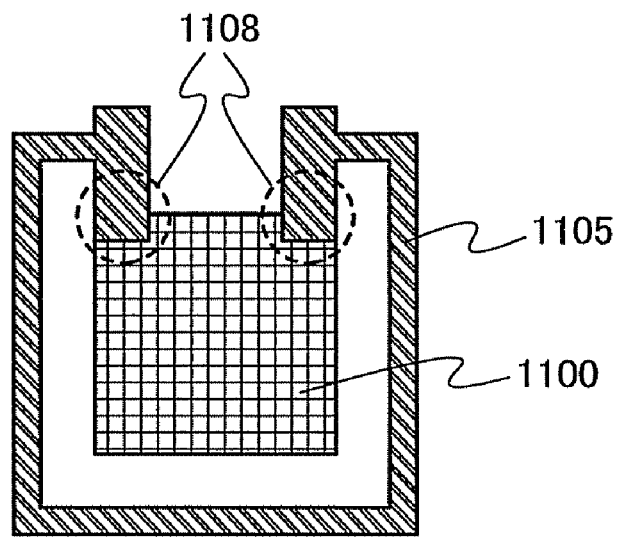
FIGS. 12A and 12B are diagrams illustrating a manufacturing method of a semiconductor device which is one embodiment of the present invention.
Figure 12B:
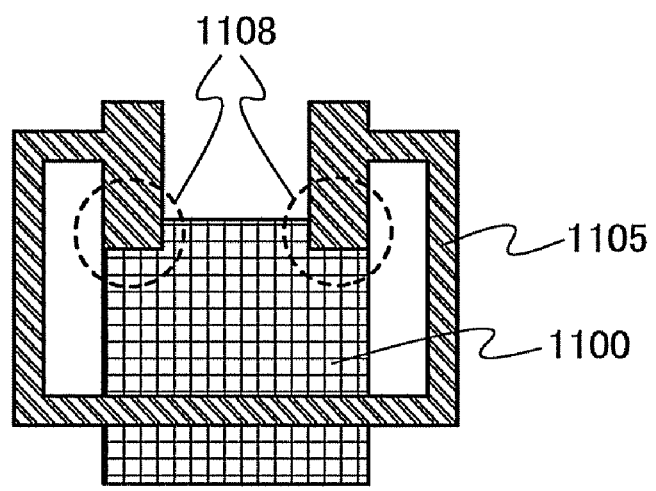

Further, in FIG. 12A, the antenna 1105 is provided so as to surround the semiconductor integrated circuit chip 1100. The antenna 1105 is provided in a different region from the semiconductor integrated circuit chip 1100 except for portions which correspond to power feeding points 1108 shown by dashed lines. However, the present invention is not limited to this structure. As shown in FIG. 12B, the antenna 1105 may be provided so as to at least partly overlap with the semiconductor integrated circuit chip 1100 except for the portions which correspond to the power feeding points 1108. Note that by providing the antenna 1105 in a region which is different from a region where semiconductor integrated circuit chip 1100 is provided, parasitic capacitance generated between the antenna 1105 and the semiconductor integrated circuit chip 1100 can be reduced.

In FIGS. 11A to 11C, the antenna 1105 can transmit and receive a signal or supply electric power from/to the conductive layer 1111 serving as an antenna included in the semiconductor integrated circuit chip 1100 mainly at the power feeding point 1107 surrounded by a dashed line through electromagnetic induction. Further, the antenna 1105 can transmit and receive a signal or supply electric power from/to an interrogator through radio waves mainly in a region except for the power feeding point 1107 shown by the dashed line. The frequency of the radio wave used as a carrier (carrier wave) between the interrogator and the semiconductor device is preferably more than or equal to 30 MHz and less than or equal to 5 GHz in this case. For example, a frequency band of 950 MHz, 2.45 GHz, or the like may be used.

In addition, although the power feeding point 1107 shown by the dashed line has a rectangular loop shape with a winding number of 1, the shape of the antenna 1105 is not limited to this structure in the present invention. The shape of a looped portion is not limited to rectangle and may have a curved shape such as a circular shape. Further, the number of winding is not limited to 1 and may be plural.

The semiconductor device which is one embodiment of the present invention can employ an electromagnetic induction method, an electromagnetic coupling method, or a microwave method. In the case of a microwave method, the shape of the antenna 1105 may be decided as appropriate in accordance with on the wavelength of an electromagnetic wave.

For example, in the case of employing a microwave method (e.g., a UHF band (860 to 960 MHz band), a 2.45 GHz band, or the like) as the signal transmission method in the semiconductor device, the length and shape of the antenna may be appropriately set in consideration of a wavelength of an electromagnetic wave used for signal transmission. For example, the antenna can be formed into a linear shape (e.g., a dipole antenna) or a flat shape (e.g., a patch antenna or an antenna having a ribbon shape). Further, the antenna is not limited to a linear shape, and the antenna may have a curved shape, a serpentine curved shape, or in a shape combining them in consideration of the wavelength of the electromagnetic wave.

In the semiconductor device to which the present invention is applied, the conductive shield provided over the semiconductor integrated circuit and the antenna prevents an electrostatic breakdown (malfunctions of the circuit or damages of a semiconductor element) of the semiconductor integrated circuit due to electrostatic discharge. Further, with the use of the pair of insulators which sandwich the semiconductor integrated circuit, a highly reliable semiconductor device that is reduced in thickness and size and has resistance to an external stress can be provided. Further, defects of shapes and characteristics due to an external stress or electrostatic discharge are prevented in the manufacturing process, so that a semiconductor device can be manufactured with high yield. Therefore, the present invention is effective in the case of a small semiconductor device to/from which data can be input and output without contact as described in this embodiment. Since the semiconductor device of this embodiment has high reliability against an external force, a condition of an environment in which the semiconductor device can be used is widened and thus, an application range of the semiconductor device can be widened.

Embodiment 6

In this embodiment, an example of application of the above-described semiconductor device capable of inputting and outputting data without contact, which is formed using the present invention, will be described. The semiconductor device which can input and output data without contact is also referred to as an RFID tag, an ID tag, an IC tag, an IC chip, an RF tag, a wireless tag, an electronic tag, or a wireless chip depending on application modes.

Figure 13A:
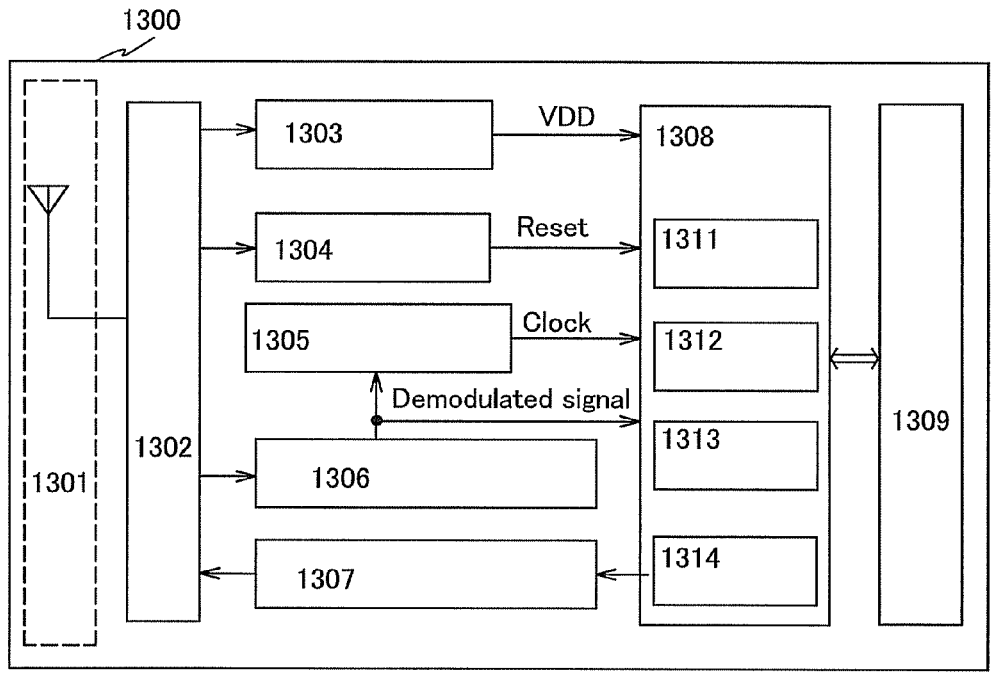
FIGS. 13A to 13C are diagrams each illustrating an application example of a semiconductor device which is one embodiment of the present invention.

The semiconductor device 1300 shown in FIG. 13A has a function of exchanging data without contact, and includes a high-frequency circuit 1302, a power supply circuit 1303, a reset circuit 1304, a clock generating circuit 1305, a data demodulating circuit 1306, a data modulating circuit 1307, a control circuit 1308 for controlling other circuits, a memory circuit 1309, and an antenna 1301. The high frequency circuit 1302 is a circuit which receives a signal from the antenna 1301 and outputs a signal received by the data modulation circuit 1307 from the antenna 1301. The power supply circuit 1303 is a circuit which generates a power supply potential from the received signal. The reset circuit 1304 is a circuit which generates a reset signal. The clock generation circuit 1305 is a circuit which generates a variety of clock signals based on the received signal input from the antenna 1301. The data demodulation circuit 1306 is a circuit which demodulates the received signal and outputs the signal to the control circuit 1308. The data modulation circuit 1307 is a circuit which modulates a signal received from the control circuit 1308. As the control circuit 1308, a code extraction circuit 1311, a code judgment circuit 1312, a CRC determination circuit 1313, an output unit circuit 1314, and the like are formed, for example. In addition, the code extraction circuit 1311 is a circuit which extracts each of plural codes included in the command that has been transmitted to the control circuit 1308. The code judgment circuit 1312 is a circuit which compares an extracted code and code corresponding to reference, and determines the content of a command. The CRC judgment circuit 1313 is a circuit which detects the presence of transmission error based on a determined code.

Next, an example of operation of the above-described semiconductor device will be described. First, a radio signal is received by the antenna 1301. The radio signal is transmitted to the power supply circuit 1303 via the high frequency circuit 1302, and a high power supply potential (hereinafter referred to as VDD) is generated. The VDD is supplied to each circuit in the semiconductor device 1300. In addition, a signal transmitted to the data demodulation circuit 1306 through the high frequency circuit 1302 is demodulated (hereinafter the signal is referred to as a demodulated signal). Moreover, signals which has passed through the reset circuit 1304 and the clock generation circuit 1305 via the high-frequency circuit 1302, and the demodulated signal are sent to the control circuit 1308. The signal transmitted to the control circuit 1308 is analyzed by the code extraction circuit 1311, the code determination circuit 1312, the CRC determination circuit 1313, and the like. Then, in accordance with the analyzed signal, information of the semiconductor device stored in the storage circuit 1309 is output. The output information of the semiconductor device is encoded through the output unit circuit 1314. In addition, the encoded information of the semiconductor device 1300 passes through the data modulation circuit 1307 to be transmitted through a radio signal by the antenna 1301. Note that the low power supply potential (hereinafter referred to as VSS) is common to the plurality of circuits which form the semiconductor device 1300; therefore, GND can be used as the VSS.

In this manner, data in the semiconductor device can be read by transmission of a signal to the semiconductor device 1300 from a communication device and by reception of a signal which is transmitted from the semiconductor device 1300 by the communication device.

In addition, the semiconductor device 1300 may supply a power supply voltage to each circuit by an electromagnetic wave without a power supply (battery) mounted, or by an electromagnetic wave and a power supply (battery) mounted.

Figure 13B:
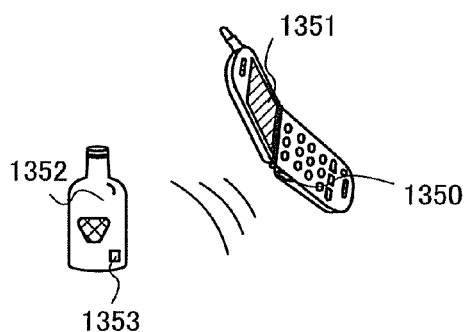
Figure 13C:
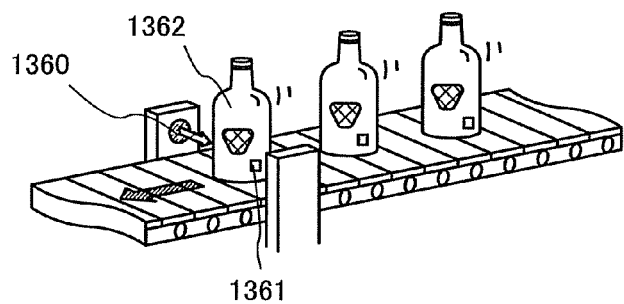

Next, an example of usage of a semiconductor device in which data can be input and output without contact is described. A side surface of a mobile terminal which includes a display portion 1351 is provided with a communication device 1350. A side surface of an article 1352 is provided with a semiconductor device 1353 (FIG. 13B). When the communication device 1350 is put close to the semiconductor device 1353 on the article 1352, information of the article 1352, such as its raw material, its place of production, inspection results for each production step, the history of distribution, or a description of the article, is displayed on the display portion 1351. Further, when a product 1362 is conveyed by a conveyer belt, the product 1362 can be inspected by using a communication device 1360 and a semiconductor device 1361 provided on the product 1362 (see FIG. 13C). In this manner, information can be easily obtained, and high functions and high added values are realized by utilizing a semiconductor device for a system.

Thus, a semiconductor device which is one embodiment of the present invention has high reliability and a very wide range of application.

Embodiment 7

According to the present invention, a semiconductor device functioning as a chip having a processor circuit (hereinafter also referred to as a processor chip, a wireless chip, a wireless processor, a wireless memory, or a wireless tag) can be formed. Note that an applicable range of the semiconductor device which is one embodiment of the present invention is wide, and the semiconductor device can be applied to any product as long as it clarifies information of an object, such as the history thereof, without contact and is useful for production, management, or the like. For example, the semiconductor device of the present invention may be incorporated in bills, coins, securities, certificates, bearer bonds, containers for packages, books, recording media, personal belongings, vehicles, foods, garments, healthcare items, livingware, medicals, and electronic apparatuses. Examples of them are explained with reference to FIGS. 14A to 14G.

Figure 14A:
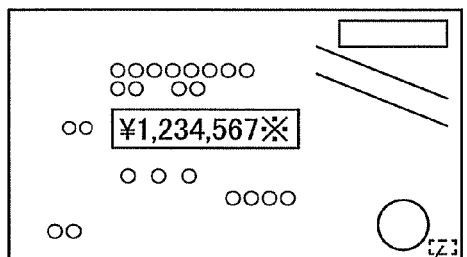
FIGS. 14A to 14G are diagrams each illustrating an application example of a semiconductor device which is one embodiment of the present invention.
Figure 14B:
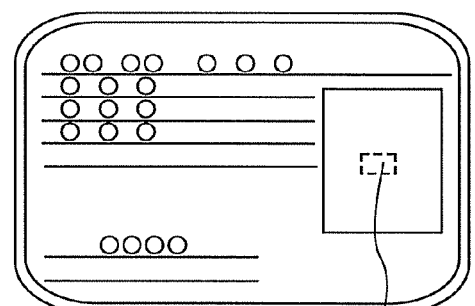
Figure 14C:
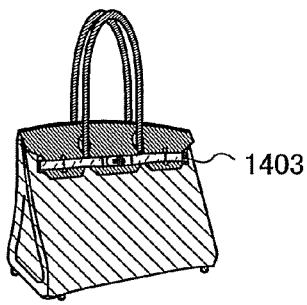
Figure 14D:
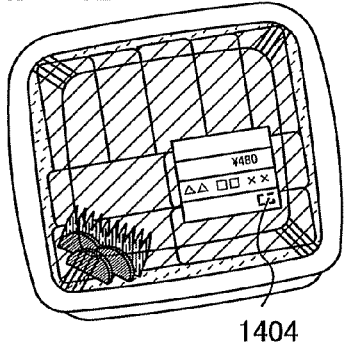
Figure 14E:
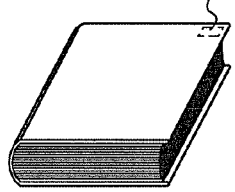
Figure 14F:
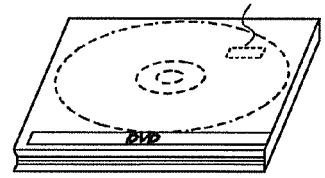
Figure 14G:
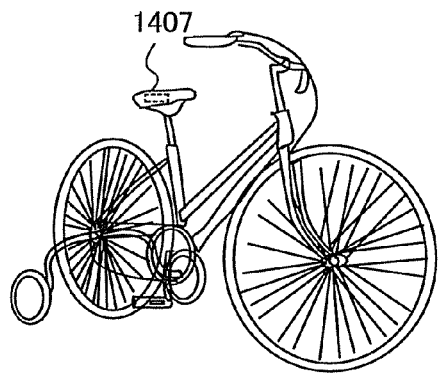

The bills and coins are money that circulates in the market, and includes one that can be used in the same way as money in a specific area (cash voucher), a commemorative coin, and the like. The securities refer to checks, certificates, promissory notes, and the like, which can be provided with a chip 1401 having a processor circuit (FIG. 14A). The certificates include driver's licenses, certificates of residence, and the like, and can be provided with a chip 1402 including a processor circuit (see FIG. 14B). The personal belongings include bags, a pair of glasses, and the like, and can be provided with a chip 1403 including a processor circuit (see FIG. 14C). The bearer bonds refer to stamps, rice coupons, various merchandise coupons, and the like. The containers for packages refer to wrapping paper for food containers and the like, plastic bottles, and the like, and can be provided with a chip 1404 having a processor circuit (see FIG. 14D). The books refer to hardbacks, paperbacks, and the like, and can be provided with a chip 1405 including a processor circuit (FIG. 14E). The recording media refer to DVD software, video tapes, and the like and can be provided with a chip 1406 including a processor circuit (see FIG. 14F). The vehicles refer to wheeled vehicles such as bicycles, ships, and the like, and can be provided with a chip 1407 having a processor circuit (FIG. 14G). The foods indicate foods, beverages, and the like. The garments indicate clothes, shoes, and the like. The healthcare items indicate a medical apparatus, a health appliance, and the like. The livingwares indicate furniture, lighting apparatus, and the like. The medicals indicate a drug, an agricultural chemical, and the like. The electronic apparatuses indicate a liquid crystal display device, an EL display device, television sets (a television receiver and a thin television receiver), a cellular phone, and the like.

The semiconductor device can be provided by being attached to the surface of an article or being embedded in an article. For example, in the case of a book, the semiconductor device may be embedded in the paper; and in the case of a package made of an organic resin, the semiconductor device may be embedded in the organic resin.

As described above, the efficiency of an inspection system, a system used in a rental shop, or the like can be improved by providing the containers for packages, the recording media, the personal belongings, the foods, the garments, the livingwares, the electronic apparatuses, or the like with the semiconductor device. In addition, by providing the vehicles with the semiconductor device, forgery or theft can be prevented. In addition, when the semiconductor device is implanted into creatures such as animals, each creature can be identified easily. For example, by enveloping or attaching the semiconductor device with a sensor in/to a creature such as livestock, its health condition such as a current body temperature as well as its birth year, sex, breed, or the like can be easily managed.

Note that this embodiment can be implemented in combination with any of Embodiments 1 to 6 and Embodiment 8 as appropriate.

Embodiment 8

In this embodiment, an example of mounting a semiconductor device which is one embodiment of the present invention is described with reference to FIGS. 15A to 15D.

A semiconductor device which is one embodiment of the present invention can be mounted on an article, as described in Embodiment 7. In this embodiment, an example is described in which a flexible semiconductor device mounted on a flexible substrate is formed.

Figure 15A:
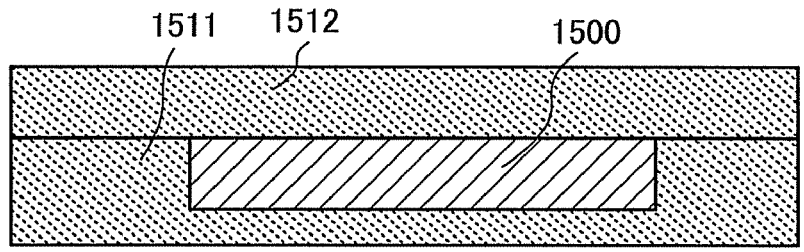
FIGS. 15A to 15D are diagrams illustrating a manufacturing method of a semiconductor device which is one embodiment of the present invention.
Figure 15B:
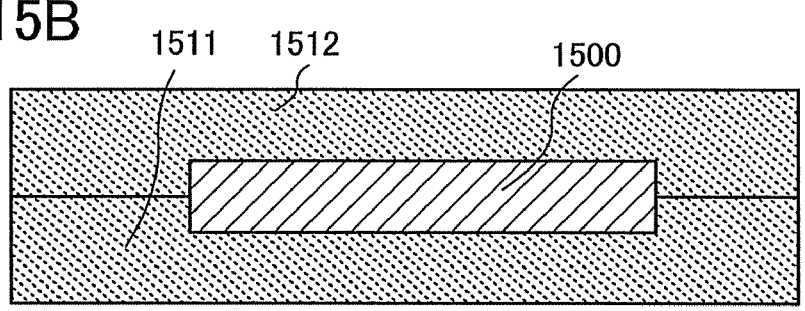
Figure 15C:
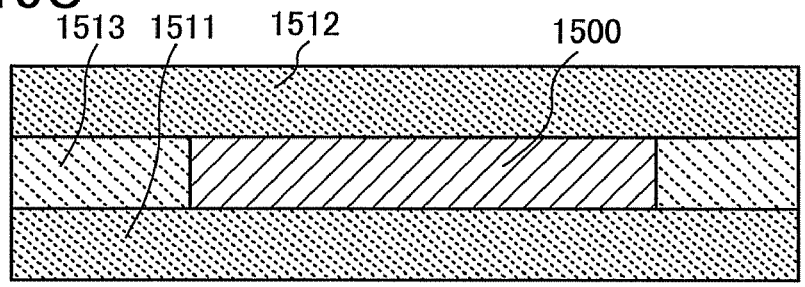

An example in which a semiconductor integrated circuit chip is embedded in a flexible substrate is illustrated in FIGS. 15A to 15C. Any of the semiconductor devices described in Embodiments 1 to 6 can be used for the semiconductor integrated circuit chip, and here, semiconductor integrated circuits which are individually separated in chip forms are referred to as semiconductor integrated circuit chips. A semiconductor integrated circuit chip 1500 is described in detail in FIG. 15D. Although the semiconductor integrated circuit chip in FIG. 15D is an example of using Embodiment 1, this embodiment can be applied to the other embodiments and is not limited to this structure.

Figure 15D:
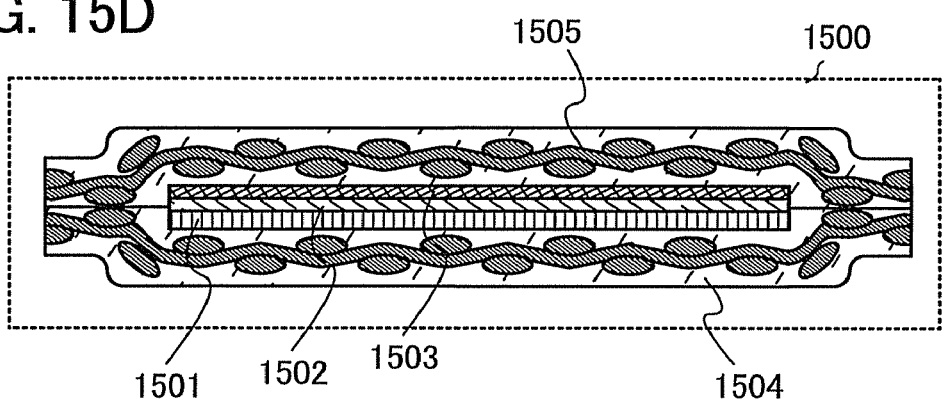

As shown in FIG. 15D, insulators 1504 and 1505 sandwich a semiconductor integrated circuit 1501, an antenna 1502, and a conductive shield 1503 and seal their side surfaces. Although not particularly shown, the semiconductor integrated circuit 1501 and the antenna 1502 are electrically connected to each other, and an insulator is provided between the antenna 1502 and the conductive shield 1503 so as not to directly contact them to each other. In this embodiment, after the insulators 1504 and 1505 are attached to each other with a plurality of semiconductor integrated circuits 1501, antennas 1502, and conductive shields 1503, which are arranged in the planar direction, sandwiched therebetween, the semiconductor integrated circuits, the antennas, and the conductive shields are separated into the individual semiconductor integrated circuit chips 1500. There is no particular limitation on a separation means as long as physical separation is possible, and separation is performed by laser beam irradiation in this embodiment. By the separation, the semiconductor integrated circuit 1501 is sealed with the insulators 1504 and 1505.

With the use of a conductive shield formed over the antenna 1502, an electrostatic breakdown (malfunctions of the circuit or damages to a semiconductor element) of the semiconductor integrated circuit due to electrostatic discharge is prevented. Further, with the use of a pair of insulators which sandwiches the semiconductor integrated circuit therebetween, a highly reliable semiconductor device that is reduced in thickness and size and has resistance to an external stress can be provided. Further, defects of shapes and characteristics due to an external stress or electrostatic discharge are prevented in the manufacturing process, so that a semiconductor device can be manufactured with high yield.

In FIG. 15A, the semiconductor integrated circuit chip 1500 is sandwiched between a flexible substrate 1511 and a flexible substrate 1512, and the semiconductor integrated circuit chip 1500 is provided in a depressed portion fowled in the flexible substrate 1511.

The depressed portion in which the semiconductor integrated circuit chip 1500 is provided may be formed in one flexible substrate or may be formed in both flexible substrates. In FIG. 15B, an example is illustrated in which the semiconductor integrated circuit chip 1500 is provided in the depressed portions provided in both the flexible substrate 1511 and the flexible substrate 1512.

Further, a flexible substrate may have a three-layer structure and a central flexible substrate may be provided with an opening in which the semiconductor integrated circuit chip 1500 is provided. In FIG. 15C, an example is illustrated in which an opening is formed in a flexible substrate 1513, the semiconductor integrated circuit chip 1500 is provided in the opening, and the flexible substrate 1513 and the semiconductor integrated circuit chip 1500 are sandwiched between the flexible substrate 1511 and the flexible substrate 1512.

In FIGS. 15A to 15C, a flexible substrate may be further stacked on the outside of the flexible substrate 1511 and/or the flexible substrate 1512.

For each of the flexible substrates 1511, 1512, and 1513, a woven fabric which is woven using bundles of fibers (single yarns) (hereinafter, the bundles of fibers are referred to as yarn bundles) for warp yarns and weft yarns, a nonwoven fabric obtained by stacking yarn bundles of plural kinds of fibers randomly or in one direction, paper, or the like can be used. Specifically, the following can be used: a substrate formed from polyethylene terephthalate (PET), polyethylene naphthalate (PEN), polyethersulfone (PES), polypropylene, polypropylene sulfide, polycarbonate, polyetherimide, polyphenylene sulfide, polyphenylene oxide, polysulfone, polyphthalamide, or the like; a substrate formed from polypropylene, polyester, vinyl, polyvinyl fluoride, vinyl chloride, polyamide, or the like; a film; paper formed from a fibrous material; and the like. A layered film of an adhesive synthetic resin film (such as an acrylic synthetic resin or an epoxy synthetic resin), or the like can be used. When a substrate or a film is bonded to a subject to be processed, a bonding layer may be used. A condition can be selected in accordance with the kind of the substrate or the film, and bonding can be performed by thermal treatment or application of pressure. The bonding layer corresponds to a layer containing an adhesive agent such as a thermosetting resin, an ultraviolet-curable resin, an epoxy resin-based adhesive agent, or a resin additive agent.

As in this embodiment, when a depressed portion or an opening is formed in a flexible substrate on which a semiconductor integrated circuit chip is mounted and the semiconductor integrated circuit chip 1500 is provided so as to be embedded in the depressed portion or the opening, a projected portion is not formed due to the provision of the semiconductor integrated circuit chip 1500; therefore, the surface of the flexible substrate is flat, and film thickness can be uniform. Accordingly, even if pressure treatment is performed with a roller or the like for attachment when a semiconductor integrated circuit chip is mounted on a flexible substrate, pressure can be prevented from being locally applied on the semiconductor integrated circuit chip (pressure concentration). Therefore, damages of the semiconductor integrated circuit chip can be reduced in a mounting step, whereby the yield of a semiconductor device is improved. In addition, even after a semiconductor integrated circuit chip is mounted, a highly reliable semiconductor device which has high resistance to external stress can be formed.

In addition, since a surface can be flat and smooth, stacking is easily performed, which facilitates storage, transfer using a machine, and the like. Further, a semiconductor integrated circuit chip is not visually identified from the outside (a projected portion that reflects the shape of the semiconductor integrated circuit chip is not generated on the surface); therefore, a semiconductor device with high security can be formed.

Although the example of providing the conductive shield on the top side of the antenna with the insulator provided therebetween is shown in the aforementioned embodiments, the present invention is not limited to this. For example, the conductive shield may be provided on a surface which is on the opposite side of the antenna across the semiconductor integrated circuit with the insulator provided therebetween.

By providing the conductive shield on one of the top or bottom side of the semiconductor integrated circuit and the antenna, a breakdown of the semiconductor integrated circuit due to electrostatic discharge is prevented and, since the semiconductor integrated circuit and the antenna include a side on which the conductive shield is not provided, successful transmission and reception of radio waves is possible without attenuation of the radio waves.

Embodiment 9

This embodiment is described with reference to FIG. 16. Since the conductive shield protects the semiconductor integrated circuit from electrostatic discharge, a conductive material is preferably used for the conductive shield. However, since attenuation of electromagnetic waves in the conductive material is significant, a communication distance is greatly influenced. In this embodiment, an example of an island-shaped conductive shield for protecting the semiconductor integrated circuit from electrostatic discharge and limiting attenuation of electromagnetic waves transmitted and received through the antenna to the minimum is shown.

Figure 16:
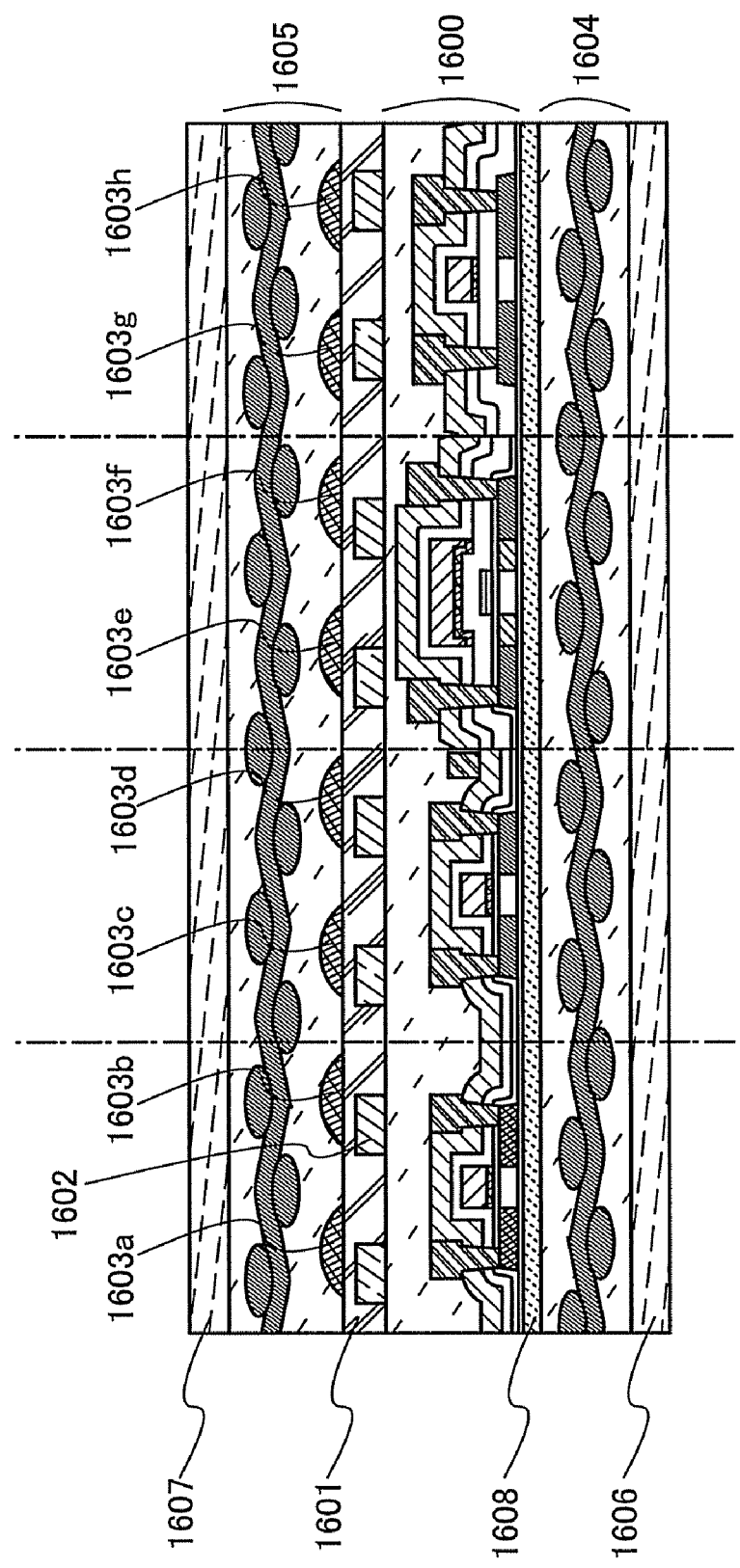
FIG. 16 is a diagram illustrating a manufacturing method of a semiconductor device which is one embodiment of the present invention.

FIG. 16 shows a state in which a semiconductor integrated circuit 1600, an antenna 1602, an insulator 1601, and island-shaped conductive shields 1603*a* to 1603*h* are sandwiched between insulators 1604 and 1605, and between insulators 1606 and 1607. As each of the insulators 1604 and 1605, a structural body in which a fibrous body is impregnated with an organic resin is used. The insulator 1604 is bonded to the semiconductor integrated circuit 1600 with the bonding layer 1608 provided therebetween.

When the conductive shield is provided over the semiconductor integrated circuit 1600 and the antenna 1602 with the insulator 1601 provided therebetween, by optimizing deposition pressure, conditions, or the like of a conductive material for forming the conductive shield, the conductive material can be formed so as to be distributed in island shapes as shown by the island-shaped conductive shields 1603*a* to 1603*h* on the insulator 1601. Each of the island-shaped conductive shields 1603*a* to 1603*h* is an island-shaped conductor formed using the conductive material and has conductivity. However, the island-shaped conductive shields 1603*a* to 1603*h* are not connected to each other.

When the conductive material is formed into island shapes in this manner, characteristics which are advantageous to protect the semiconductor integrated circuit 1600 from electrostatic discharge are obtained and the island-shaped conductive shields are not in the form of a film as a whole, whereby attenuation of radio waves transmitted and received through the antenna can be limited to the minimum.

This application is based on Japanese Patent Application serial No. 2008-246083 filed with the Japan Patent Office on Sep. 25, 2008, the entire contents of which are hereby incorporated by reference.

EXPLANATION OF REFERENCE

100 Semiconductor integrated circuit; 101 Antenna; 102 Insulator; 103 Conductive shield; 104*a* Insulator; 104*b* Insulator; 105*a* Insulator; 105*b* Insulator; 150 End portion; 201*a* Fibrous body; 201*b* Fibrous body; 202*a* Organic resin; 202*b* Organic resin; 300 Semiconductor integrated circuit; 301 Antenna; 302 Insulator; 303 Conductive shield; 304*a* Insulator; 304*b* Insulator; 305*a* Insulator; 305*b* Insulator; 310 Substrate; 311 Separation layer; 320*a* Fibrous body; 320*b* Fibrous body; 321*a* Organic resin; 321*b* Organic resin; 400 Substrate; 401 Separation layer; 403*a* Impurity region; 403*b* Impurity region; 404*a* Source region or drain region; 404*b* Source region or drain region; 406 Channel formation region; 407 Gate insulating layer; 408 Gate electrode layer; 409*a* Insulating layer; 409*b* Insulating layer; 410 Transistor; 411 Transistor; 412 Insulating film; 413 Insulating film; 414 Insulating film; 415 Insulating film; 420*a* Wiring layer; 420*b* Wiring layer; 423*a* Impurity region; 423*b* Impurity region; 424*a* Source region or drain region; 424*b* Source region or drain region; 426 Channel formation region; 427 Gate insulating layer; 428 Gate electrode layer; 429*a* Insulating layer; 429*b* Insulating layer; 430*a* Wiring layer; 430*b* Wiring layer; 440 Antenna; 441 Insulator; 442*a* Insulator; 442*b* Insulator; 443*a* Fibrous body; 443*b* Fibrous body; 444*a* Organic resin; 444b Organic resin; 450 Semiconductor integrated circuit; 480 Conductive shield; 600 Substrate; 601 Separation layer; 602 Insulating film; 603 Semiconductor layer; 604 Semiconductor layer; 605 Semiconductor layer; 606 Semiconductor layer; 608 Gate insulating layer; 609 Gate insulating layer; 610 Insulating film; 611 Charge accumulation layer; 612 Gate electrode layer; 613 Gate electrode layer; 614 Gate electrode layer; 615 Control gate electrode layer; 616 Gate electrode layer; 617 Gate electrode layer; 618 Gate electrode layer; 619 Control gate electrode layer; 620 Impurity element; 621 Mask; 622a P-type impurity region; 622b P-type impurity region; 623 Channel formation region; 624 Impurity element; 625 Mask; 626a N-type impurity region; 626b N-type impurity region; 627a N-type impurity region; 627b N-type impurity region; 628a N-type impurity region; 628b N-type impurity region; 629 Channel formation region; 630 Channel formation region; 631 Channel formation region; 650 Semiconductor integrated circuit; 662a N-type impurity region; 662b N-type impurity region; 664a N-type impurity region; 664b N-type impurity region; 667 Insulating film; 668 Insulating film; 669a Wiring layer; 669b Wiring layer; 670a Wiring layer; 670b Wiring layer; 671a Wiring layer; 671b Wiring layer; 672a Wiring layer; 672b Wiring layer; 673 Thin film transistor; 674 Thin film transistor; 675 Memory element; 676 Thin film transistor; 680 Conductive layer; 681 Insulator; 682 Conductive shield; 683 Insulator; 685 Insulator; 686 Fibrous body; 687 Organic resin; 689 Bonding layer; 690 Insulating layer; 801 Insulator; 900 Microprocessor; 901 Arithmetic logic unit; 902 Arithmetic logic unit controller; 903 Instruction decoder; 904 Interrupt controller; 905 Timing controller; 906 Register; 907 Register controller; 908 Bus interface; 909 Read only memory (ROM); 910 Memory interface; 1001 RFCPU; 1002 Analog circuit portion; 1003 Digital circuit portion; 1004 Resonance circuit; 1005 Rectifier circuit; 1006 Constant voltage circuit; 1007 Reset circuit; 1008 Oscillator circuit; 1009 Demodulation circuit; 1010 Modulation circuit; 1011 RF interface; 1012 Control register; 1013 Clock controller; 1014 CPU Interface; 1015 Central Processing Unit (CPU); 1016 Random access memory (RAM); 1017 Read only memory (ROM); 1018 Antenna; 1019 Capacitor portion; 1020 Power supply control circuit; 1100 Semiconductor integrated circuit chip; 1104 Insulating layer; 1105 Antenna; 1106 Supporting substrate; 1107 Feeding point; 1108 Feeding point; 1110 Semiconductor integrated circuit; 1111 Conductive layer; 1112 Conductive shield; 1113 Insulator; 1114 Insulator; 1300 Semiconductor device; 1301 Antenna; 1302 High frequency circuit; 1303 Power supply circuit; 1304 Reset circuit; 1305 Clock generation circuit; 1306 Data demodulation circuit; 1307 Data modulation circuit; 1308 Control circuit; 1309 Storage circuit; 1311 Code extraction circuit; 1312 Code judgment circuit; 1313 CRC judgment circuit; 1314 Output unit circuit; 1350 Communication device; 1351 Display portion; 1352 Article; 1353 Semiconductor device; 1360 Communication device; 1361 Semiconductor device; 1362 Product; 1401 Chip; 1402 Chip; 1403 Chip; 1404 Chip; 1405 Chip; 1406 Chip; 1407 Chip; 1500 Semiconductor integrated circuit chip; 1501 Semiconductor integrated circuit; 1502 Antenna; 1503 Conductive shield; 1504 Insulator; 1505 Insulator; 1511 Flexible substrate; 1512 Flexible substrate; 1513 Flexible substrate; 1600 Semiconductor integrated circuit; 1601 Insulator; 1602 Antenna; 1603a Island-shaped conductive shield; 1603b Island-shaped conductive shield; 1603c Island-shaped conductive shield; 1603d Island-shaped conductive shield; 1603e Island-shaped conductive shield; 1603f Island-shaped conductive shield; 1603g Island-shaped conductive shield; 1603h Island-shaped conductive shield; 1604 Insulator; 1605 Insulator; 1606 Insulator; 1607 Insulator; 1608 Bonding layer

The invention claimed is:

1. A semiconductor device comprising:
a semiconductor integrated circuit;
an antenna electrically connected to the semiconductor integrated circuit;
a conductive film provided so as to overlap with the semiconductor integrated circuit with a first insulator provided therebetween; and
a second insulator provided so that the semiconductor integrated circuit, the antenna, and the conductive film are surrounded by the second insulator,
wherein the second insulator includes a fibrous body impregnated with a resin.

2. The semiconductor device according to claim 1, wherein the conductive film includes metal.

3. The semiconductor device according to claim 2, wherein the metal is a titanium film with a thickness of greater than or equal to 5 nm and less than or equal to 100 nm.

4. The semiconductor device according to claim 1, wherein the conductive film includes metal oxide.

5. The semiconductor device according to claim 4, wherein the metal oxide is an indium tin oxide film with a thickness of greater than or equal to 5 nm and less than or equal to 100 nm containing silicon oxide.

6. The semiconductor device according to claim 1, wherein the conductive film includes semiconductor or metal nitride.

7. The semiconductor device according to claim 1, wherein the conductive film has a structure in which island-shaped conductors formed using metal, metal oxide, semiconductor, or metal nitride are scattered.

8. The semiconductor device according to claim 1, wherein the thickness of at least one of the first insulator and the second insulator is greater than or equal to 5 μm and less than or equal to 50 μm.

9. The semiconductor device according to claim 1, wherein the second insulator has an elasticity of more than or equal to 5 GPa and less than or equal to 15 GPa.

10. The semiconductor device according to claim 1, wherein the conductive film is electrically isolated from the semiconductor integrated circuit.

11. A semiconductor device comprising:
a semiconductor integrated circuit;
an antenna electrically connected to the semiconductor integrated circuit;
a conductive film provided so as to overlap with the semiconductor integrated circuit with a first insulator provided therebetween;
a second insulator provided so that the semiconductor integrated circuit, the antenna, and the conductive film are surrounded by the second insulator; and
a third insulator provided so that the second insulator is surrounded by the third insulator.

12. The semiconductor device according to claim 11, wherein the second insulator includes a fibrous body impregnated with a resin.

13. The semiconductor device according to claim 11, wherein the conductive film includes metal.

14. The semiconductor device according to claim 13, wherein the metal is a titanium film with a thickness of greater than or equal to 5 nm and less than or equal to 100 nm.

15. The semiconductor device according to claim 11, wherein the conductive film includes metal oxide.

16. The semiconductor device according to claim 15, wherein the metal oxide is an indium tin oxide film with a thickness of greater than or equal to 5 nm and less than or equal to 100 nm containing silicon oxide.

17. The semiconductor device according to claim 11, wherein the conductive film includes semiconductor or metal nitride.

18. The semiconductor device according to claim 11, wherein the conductive film has a structure in which island-shaped conductors formed using metal, metal oxide, semiconductor, or metal nitride are scattered.

19. The semiconductor device according to claim 11, wherein the thickness of at least one of the first insulator and the second insulator is greater than or equal to 5 µm and less than or equal to 50 µm.

20. The semiconductor device according to claim 11, wherein the second insulator has an elasticity of more than or equal to 5 GPa and less than or equal to 15 GPa.

21. The semiconductor device according to claim 11, wherein the conductive film is electrically isolated from the semiconductor integrated circuit.

22. A semiconductor device comprising:
a semiconductor integrated circuit;
an antenna electrically connected to the semiconductor integrated circuit;
a conductive film provided so as to overlap with the semiconductor integrated circuit with a first insulator provided therebetween;
a second insulator provided so that the semiconductor integrated circuit, the antenna, and the conductive film are surrounded by the second insulator; and
a third insulator provided so that the second insulator is surrounded by the third insulator,
wherein the second insulator includes a fibrous body impregnated with a resin, and
wherein the second insulator has a region which is melted and fused together.

23. The semiconductor device according to claim 22, wherein the conductive film includes metal.

24. The semiconductor device according to claim 23, wherein the metal is a titanium film with a thickness of greater than or equal to 5 nm and less than or equal to 100 nm.

25. The semiconductor device according to claim 22, wherein the conductive film includes metal oxide.

26. The semiconductor device according to claim 25, wherein the metal oxide is an indium tin oxide film with a thickness of greater than or equal to 5 nm and less than or equal to 100 nm containing silicon oxide.

27. The semiconductor device according to claim 22, wherein the conductive film includes semiconductor or metal nitride.

28. The semiconductor device according to claim 22, wherein the conductive film has a structure in which island-shaped conductors formed using metal, metal oxide, semiconductor, or metal nitride are scattered.

29. The semiconductor device according to claim 22, wherein the thickness of at least one of the first insulator and the second insulator is greater than or equal to 5 µm and less than or equal to 50 µm.

30. The semiconductor device according to claim 22, wherein the second insulator has an elasticity of more than or equal to 5 GPa and less than or equal to 15 GPa.

31. The semiconductor device according to claim 22, wherein the conductive film is electrically isolated from the semiconductor integrated circuit.

32. The semiconductor device according to claim 1, wherein the conductive film acts as a conductive shield.

33. The semiconductor device according to claim 11, wherein the conductive film acts as a conductive shield.

34. The semiconductor device according to claim 22, wherein the conductive film acts as a conductive shield.

* * * * *

UNITED STATES PATENT AND TRADEMARK OFFICE
CERTIFICATE OF CORRECTION

| | | |
|---|---|---|
| PATENT NO. | : 8,102,034 B2 | Page 1 of 1 |
| APPLICATION NO. | : 12/564603 | |
| DATED | : January 24, 2012 | |
| INVENTOR(S) | : Yoshiaki Oikawa and Shingo Eguchi | |

It is certified that error appears in the above-identified patent and that said Letters Patent is hereby corrected as shown below:

In the Specification:

Column 2, Line 37; Change "need" to --formed--.

Column 2, Line 41; Change "inn" to --$\mu$m--.

Column 10, Line 27; Change "$\mu$m, preferably" to --$\mu$m, more preferably--.

Column 15, Line 50; Change "Impurity" to --impurity--.

Column 17, Line 49; Change "fainted" to --formed--.

Column 26, Line 49-50; Change "pertained" to --performed--.

Column 31, Line 29; Change "1099" to --1100--.

Column 36, Line 41; Change "fowled" to --formed--.

Signed and Sealed this
Twenty-seventh Day of March, 2012

David J. Kappos
*Director of the United States Patent and Trademark Office*